US011782198B2

(12) United States Patent
Diguet

(10) Patent No.: US 11,782,198 B2
(45) Date of Patent: Oct. 10, 2023

(54) SOLAR CONTROL FILM

(71) Applicant: SAINT-GOBAIN PERFORMANCE PLASTICS CORPORATION, Solon, OH (US)

(72) Inventor: Antoine Diguet, Paris (FR)

(73) Assignee: SAINT-GOBAIN PERFORMANCE PLASTICS CORPORATION, Solon, OH (US)

( * ) Notice: Subject to any disclaimer, the term of this patent is extended or adjusted under 35 U.S.C. 154(b) by 62 days.

(21) Appl. No.: 16/622,751

(22) PCT Filed: Jun. 27, 2018

(86) PCT No.: PCT/US2018/039652
§ 371 (c)(1),
(2) Date: Dec. 13, 2019

(87) PCT Pub. No.: WO2019/005896
PCT Pub. Date: Jan. 3, 2019

(65) Prior Publication Data
US 2021/0033762 A1 Feb. 4, 2021

Related U.S. Application Data

(60) Provisional application No. 62/527,121, filed on Jun. 30, 2017, provisional application No. 62/540,665, filed on Aug. 3, 2017.

(51) Int. Cl.
*B32B 15/04* (2006.01)
*B32B 17/06* (2006.01)
*G02B 5/28* (2006.01)

(52) U.S. Cl.
CPC .................................. *G02B 5/282* (2013.01)

(58) Field of Classification Search
CPC ....................................................... G02B 5/282
USPC ...................................................... 428/434
See application file for complete search history.

(56) References Cited

U.S. PATENT DOCUMENTS

| 4,216,177 A | 8/1980 | Otto |
| 5,296,302 A | 3/1994 | O'Shaughnessy et al. |
| 5,393,593 A * | 2/1995 | Gulotta ..................... C03C 1/10 |
| | | 428/212 |

(Continued)

FOREIGN PATENT DOCUMENTS

| CN | 105745178 A | 7/2016 |
| DE | 19858227 C1 | 6/2000 |

(Continued)

OTHER PUBLICATIONS

International Search Report and Written Opinion for PCT/US2018/039652, dated Jun. 27, 2018, 16 pages.

*Primary Examiner* — Lauren R Colgan
(74) *Attorney, Agent, or Firm* — Abel Schillinger, LLP; Chi Suk Kim

(57) ABSTRACT

A composite film may include a first transparent substrate, a dielectric layer and at least two infra-red reflection stacks. The dielectric layer may be located between the at least two infra-red reflection stacks and each of the infra-red reflection stacks may include two titanium blocker layers and a functional layer. The functional layer in each infra-red reflection stack may include silver and may be located between the two blocker layers.

18 Claims, 12 Drawing Sheets

(56) References Cited

U.S. PATENT DOCUMENTS

| | | | |
|---|---|---|---|
| 6,001,462 A * | 12/1999 | Purvis | B32B 17/10036 |
| | | | 428/215 |
| 6,538,192 B1 * | 3/2003 | Coster | B32B 17/10761 |
| | | | 428/441 |
| 7,009,156 B2 | 3/2006 | Maeuser | |
| 7,342,716 B2 | 3/2008 | Hartig | |
| 7,405,872 B2 | 7/2008 | Simpson et al. | |
| 7,901,781 B2 | 3/2011 | Maschwitz et al. | |
| 9,108,882 B2 | 8/2015 | Gouardes et al. | |
| 2002/0136905 A1 * | 9/2002 | Medwick | C03C 17/3639 |
| | | | 428/432 |
| 2003/0228484 A1 | 12/2003 | Finley et al. | |
| 2004/0009356 A1 | 1/2004 | Medwick et al. | |
| 2005/0008796 A1 * | 1/2005 | Kriltz | B32B 17/1033 |
| | | | 428/34 |
| 2006/0182980 A1 * | 8/2006 | Barton | C03C 4/02 |
| | | | 501/71 |
| 2006/0213608 A1 | 9/2006 | Moineau et al. | |
| 2007/0036989 A1 | 2/2007 | Medwick et al. | |
| 2008/0105298 A1 | 5/2008 | Lu et al. | |
| 2009/0098354 A1 * | 4/2009 | Torr | B32B 17/10339 |
| | | | 428/215 |
| 2010/0062245 A1 | 3/2010 | Martin et al. | |
| 2012/0009401 A1 | 1/2012 | McCoy et al. | |
| 2012/0087005 A1 | 4/2012 | Reymond et al. | |
| 2013/0149473 A1 * | 6/2013 | Frank | C03C 17/3644 |
| | | | 428/34 |
| 2014/0237917 A1 * | 8/2014 | Theios | C03C 17/366 |
| | | | 52/203 |
| 2015/0185382 A1 * | 7/2015 | Leyder | C23C 28/322 |
| | | | 359/360 |
| 2015/0274584 A1 | 10/2015 | Kleinhempel et al. | |
| 2015/0321951 A1 | 11/2015 | Alzate et al. | |

FOREIGN PATENT DOCUMENTS

| | | |
|---|---|---|
| DE | 10164063 A1 | 5/2003 |
| EP | 2790916 A1 | 10/2014 |
| JP | 2010199418 A | 9/2010 |
| JP | 2015040263 A | 3/2015 |
| JP | 2016503385 A | 2/2016 |
| WO | 03068500 A1 | 8/2003 |
| WO | 2015102983 A1 | 7/2015 |
| WO | 2019005896 A1 | 1/2019 |

* cited by examiner

SOLAR CONTROL FILM

CROSS-REFERENCE TO RELATED APPLICATIONS

This Application is a National Stage entry under 35 U.S.C. § 371 of International Application No. PCT/US18/39652, filed Jun. 27, 2018, entitled "SOLAR CONTROL FILM," by Antoine DIGUET, which claims priority to U.S. Provisional Patent Application No. 62/540,665, filed Aug. 3, 2017, entitled "SOLAR CONTROL FILM," by Antoine DIGUET, and claims priority to U.S. Provisional Patent Application No. 62/527,121, filed Jun. 30, 2017, entitled "SOLAR CONTROL FILM," by Antoine DIGUET, which all applications are assigned to the current assignee hereof and incorporated herein by reference in their entireties.

TECHNICAL FIELD

The present disclosure relates to a solar control film. In particular, the present disclosure relates to a solar control film having particular solar energy characteristics that may be configured for use within an automobile sunroof.

BACKGROUND ART

Composite films can be used as coverings applied to windows in building or vehicles to control the passage of solar radiation through transmission, reflection, and absorption. For certain composite films, visible light transmittance and reflectance must be low and the total solar energy rejection must be high. This combination of features is of great importance for particular systems. As such, a need exists for composite films which have superior combined visible light transmittance, visible light reflectance, and total solar energy rejection properties at the desired levels.

SUMMARY

According to a first aspect, a composite film may include a first transparent substrate, a dielectric layer and at least two infra-red reflection stacks. The dielectric layer may be located between the at least two infra-red reflection stacks and each of the infra-red reflection stacks may include two titanium blocker layers and a functional layer. The functional layer in each infra-red reflection stack may include silver and may be located between the two blocker layers.

According to still another aspect, a composite film may include a first transparent substrate, a first dielectric layer located adjacent to the first transparent substrate layer, a first titanium blocker layer and may be located adjacent to the first dielectric layer, a first functional layer that may include silver and may be located adjacent to the first titanium blocker layer, a second titanium blocker layer located adjacent to the first functional layer, a second dielectric layer that may be located adjacent to the second titanium blocker layer, a third titanium blocker layer located adjacent to the second dielectric layer, a second functional layer that may include silver and may be located adjacent to the third titanium blocker layer, a fourth titanium blocker layer located adjacent to the second functional layer, a third dielectric layer that may be located adjacent to the fourth titanium blocker layer, and a second transparent substrate overlying the third dielectric layer.

According to still another aspect, a method of forming a composite film may include providing a first transparent substrate, forming a first titanium blocker layer located adjacent to the first dielectric layer, forming a first functional layer that may include silver and may be located adjacent to the first titanium blocker layer, forming a second titanium blocker layer located adjacent to the first functional layer, forming a second dielectric layer that may be located adjacent to the second titanium blocker layer, forming a third titanium blocker layer located adjacent to the second dielectric layer, forming a second functional layer that may include silver and may be located adjacent to the third titanium blocker layer, forming a fourth titanium blocker layer located adjacent to the second functional layer, forming a third dielectric layer that may be located adjacent to the fourth titanium blocker layer, and forming a second transparent substrate overlying the third dielectric layer.

According to yet another aspect, a composite film configured for application within a sunroof may include a first transparent substrate, a dielectric layer and at least two infra-red reflection stacks. The dielectric layer may be located between the at least two infra-red reflection stacks and each of the infra-red reflection stacks may include two titanium blocker layers and a functional layer. The titanium blocker layers in each infra-red reflection stack may each have a thickness of at least about 0.2 nm and not greater than about 5 nm. The functional layer in each infra-red reflection stack may include silver and may be located between the two titanium blocker layers.

According to still another aspect, a composite film configured for application within a sunroof may include a first transparent substrate, a first dielectric layer located adjacent to the first transparent substrate layer, a first titanium blocker layer located adjacent to the first dielectric layer, a first functional layer that may include silver and be located adjacent to the first titanium blocker layer, a second titanium blocker layer located adjacent to the first functional layer, a second dielectric layer that may be located adjacent to the second titanium blocker layer, a third titanium blocker layer located adjacent to the second dielectric layer, a second functional layer that may include silver and may be located adjacent to the third titanium blocker layer; a fourth titanium blocker layer located adjacent to the second functional layer, a third dielectric layer that may be located adjacent to the fourth titanium blocker layer, and a second transparent substrate overlying the third dielectric layer. The titanium blocker layers may each have a thickness of at least about 0.2 nm and not greater than about 5 nm.

According to still another aspect, a method of forming a composite film configured for application within a sunroof may include providing a first transparent substrate, forming a first titanium blocker layer located adjacent to the first dielectric layer, forming a first functional layer that may include silver and may be located adjacent to the first titanium blocker layer, forming a second titanium blocker layer located adjacent to the first functional layer, forming a second dielectric layer that may be located adjacent to the second titanium blocker layer, forming a third titanium blocker layer located adjacent to the second dielectric layer, forming a second functional layer that may include silver and may be located adjacent to the third titanium blocker layer; forming a fourth titanium blocker layer located adjacent to the second functional layer, forming a third dielectric layer that may be located adjacent to the fourth titanium blocker layer, and forming a second transparent substrate overlying the third dielectric layer. The titanium blocker layers may each have a thickness of at least about 0.2 nm and not greater than about 5 nm.

BRIEF DESCRIPTION OF THE DRAWINGS

Embodiments are illustrated by way of example and are not limited in the accompanying figures.

Figure 1:
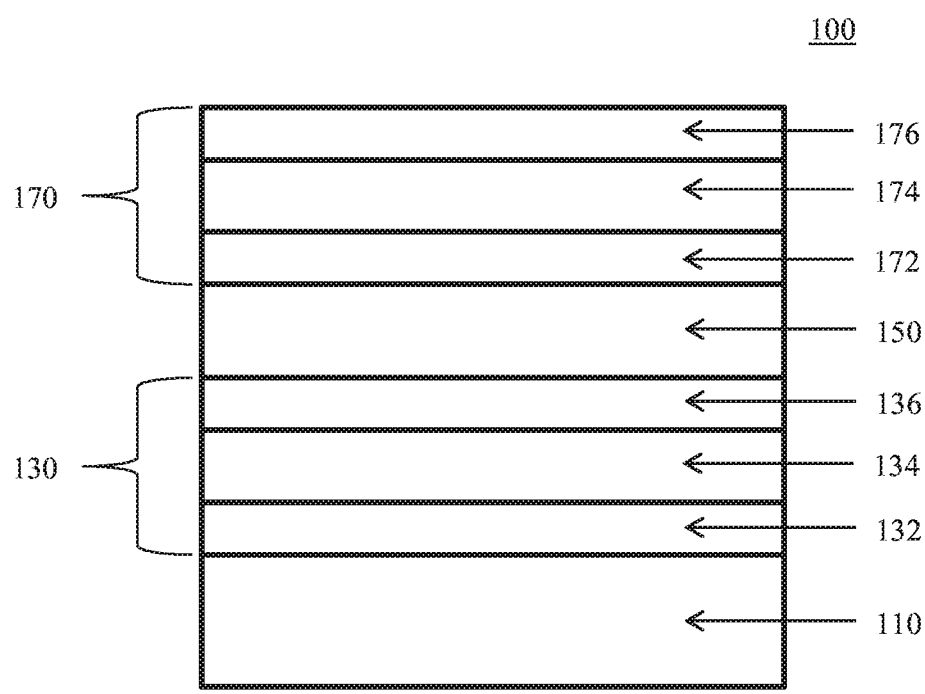
FIG. 1 includes an illustration of an example composite film according to certain embodiments described herein.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. Further, the use of the same reference symbols in different drawings indicates similar or identical items.

DETAILED DESCRIPTION OF THE PREFERRED EMBODIMENT(S)

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

As used herein, the term "visible light transmittance" or "VLT" refers to the ratio of total light visible to the human eye (i.e., having a wavelength between 380 nm and 780 nanometers) that is transmitted through a composite stack/transparent substrate system and may be calculated using an A light source at a 2° angle (i.e., VLT A 2°).

The term "total solar energy rejected" or "TSER" refers to the total solar energy (heat) that is not transferred through the composite stack/transparent substrate system and may be calculated according to the equation TSER=1-g, where g is equal to the total solar energy transmittance as defined by ISO 9050.

The term "total transmitted solar energy" or "TTS" refers to the total transmitted solar energy (heat) that is transferred through the composite stack/transparent substrate system and may be calculated according to the ISO 13837.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the solar control arts.

Embodiments described herein are generally directed to composite films that include a multi-layer structure having at least one first transparent substrate, a dielectric layer and at least two infra-red reflection stacks. The dielectric layer may be located between the at least two infra-red reflection stacks. Each infra-red reflection stack may include two titanium blocker layers and a functional layer that may be located between the two titanium blocker layers. The functional layer may include silver. The composite film formed according to embodiments described herein may have particular performance characteristics, such as, a low TTS, a low VLR, a high TSER or a combination of thereof.

These concepts are better understood in view of the embodiments described below that illustrate and do not limit the scope of the present disclosure.

FIG. 1 includes an illustration of a cross-sectional view of a portion of an example composite film 100. As shown in FIG. 1, the composite film 100 may include a first transparent substrate 110, a first infra-red reflection stack 130, a second infra-red reflection stack 170 and a first dielectric layer 150 located between that first infra-red reflection stack 130 and the second infra-red reflection stack 170. The first infra-red reflection stack 130 may include a first titanium blocker layer 132, the second titanium blocker layer 136 and a first functional layer 134. The first functional layer 134 may include silver. The second infra-red reflection stack 170 may include a third titanium blocker layer 172, a fourth titanium blocker layer 176 and a second functional layer 174. The second functional layer 174 may include silver.

According to particular embodiments, the first transparent substrate 110 may include a polymer material. According to another particular embodiment, the first transparent substrate 110 may consist of a polymer material. According to still other embodiments, the first transparent substrate 110 may be a polymer substrate layer. According to particular embodiments, the polymer substrate layer may include any desirable polymer material.

According to still other embodiments, the first transparent substrate 110 may include a polyethylene terephthalate (PET) material. According to another particular embodiment, the first transparent substrate 110 may consist of a PET material. According to still other embodiments, the first transparent substrate 110 may be a PET substrate layer. According to particular embodiments, the PET substrate layer may include any desirable polymer material.

According to yet another embodiment, the first transparent substrate 110 may include a glass material. According to yet another embodiment, the first transparent substrate 110 may consist of a glass material. According to still another embodiment, the first transparent substrate 110 may be a glass substrate layer. According to still other embodiments, the glass material may include any desirable glass material. According to still other embodiments, the glass substrate may have a VLT of at least about 85%, such as, at least about 86%, at least about 87% or even at least about 88%.

According to still other embodiments, when the first transparent substrate 110 is a polymer substrate layer, it may have a particular thickness. For example, the first transparent substrate 110 may have a thickness of at least about 10 microns, such as, at least about 15 microns, at least about 20 microns, at least about 25 microns, at least about 30 microns, at least about 35 microns, at least about 40 microns, at least about 45 microns, at least about 50 microns, at least about 75 microns, at least about 100 micron or even at least about 125 microns. According to still another embodiment, the first transparent substrate 110 may have a thickness of not greater than about 250 microns, such as, not greater than about 245 microns, not greater than about 240 microns, not greater than about 235 microns, not greater than about 230 microns, not greater than about 225 microns, not greater than about 220 microns, not greater than about 215 microns, not greater than about 210 microns, not greater than about 205 microns, not greater than about 200 microns, not greater than about 175 microns or even not greater than about 150 microns. It will be appreciated that the first transparent substrate 110 may have a thickness within a range between any of minimum and maximum values noted above. It will be further appreciated that the first transparent substrate 110 may have a thickness of any value between any of the minimum and maximum values noted above.

It will be further appreciated that when the first transparent substrate 110 is a glass substrate layer, it may have any desired thickness.

According to particular embodiments, the first functional layer 134 may include silver. According to yet another embodiment, the first functional layer 134 may consist essentially of silver. According to still another embodiment, the first functional layer 134 may be a silver layer.

According to still other embodiments, the first functional layer 134 may have a particular thickness. For example, the first functional layer 134 may have a thickness of at least about 5 nanometers, such as, at least about 6 nanometers, at least about 7 nanometers, at least about 8 nanometers, at least about 9 nanometers, at least about 10 nanometers, at least about 12 nanometers, at least about 14 nanometers, at least about 16 nanometers, at least about 18 nanometers, at least about 20 nanometers, at least about 25 nanometers, at least about 30 nanometers or even at least about 35 nanometers. According to still another embodiment, the first functional layer 134 may have a thickness of not greater than about 40 nanometers, such as, not greater than about 39 nanometers, not greater than about 38 nanometers, not greater than about 37 nanometers, not greater than about 36 nanometers, not greater than about 35 nanometers, not greater than about 34 nanometers, not greater than about 33 nanometers, not greater than about 32 nanometers or even not greater than about 31 nanometers. It will be appreciated that the first functional layer 134 may have a thickness within a range between any of minimum and maximum values noted above. It will be further appreciated that first functional layer 134 may have a thickness of any value between any of the minimum and maximum values noted above.

According to another embodiment, the first titanium blocker layer 132 may include titanium. According to still another embodiment, the first titanium blocker layer 132 may consist essentially of titanium. According to yet another embodiment, the first titanium blocker layer 132 may be referred to as a titanium layer.

According to still another embodiment, the first titanium blocker layer 132 may have a particular thickness. For example, the first titanium blocker layer 132 may have a thickness of not greater than about 10 nanometers, such as, not greater than about 9 nanometers, not greater than about 8 nanometers, not greater than about 7 nanometers, not greater than about 6 nanometers, not greater than about 5 nanometers, not greater than about 4.5 nanometers, not greater than about 4 nanometers, not greater than about 3.5 nanometers, not greater than about 3 nanometers, not greater than about 2.8 nanometers, not greater than about 2.6 nanometers, not greater than about 2.4 nanometers, not greater than about 2.2 nanometers, not greater than about 2.0 nanometers, not greater than about 1.8 nanometers, not greater than about 1.6 nanometers, not greater than about 1.4 nanometers, not greater than about 1.2 nanometers, not greater than about 1.0 nanometers, not greater than about 0.8 nanometers, not greater than about 0.6 nanometers, not greater than about 0.5 nanometers, not greater than about 0.4 nanometers, not greater than about 0.3 nanometers or even not greater than about 0.2 nanometers. According to yet another embodiment, the first titanium blocker layer 132 may have a thickness of at least about 0.1 nanometers, such as, at least about 0.2 nanometers, at least about 0.3 nanometers, at least about 0.4 nanometers. It will be appreciated that the first titanium blocker layer 132 may have a thickness within a range between any of minimum and maximum values noted above. It will be further appreciated the first titanium blocker layer 132 may have a thickness of any value between any of the minimum and maximum values noted above.

According to another embodiment, the second titanium blocker layer 136 may include titanium. According to still another embodiment, the second titanium blocker layer 136 may consist essentially of titanium. According to yet another embodiment, the second titanium blocker layer 136 may be referred to as a titanium layer.

According to still another embodiment, the second titanium blocker layer 136 may have a particular thickness. For example, the second titanium blocker layer 136 may have a thickness of not greater than about 10 nanometers, such as, not greater than about 9 nanometers, not greater than about 8 nanometers, not greater than about 7 nanometers, not greater than about 6 nanometers, not greater than about 5 nanometers, not greater than about 4.5 nanometers, not greater than about 4 nanometers, not greater than about 3.5 nanometers, not greater than about 3 nanometers, not greater than about 2.8 nanometers, not greater than about 2.6 nanometers, not greater than about 2.4 nanometers, not greater than about 2.2 nanometers, not greater than about 2.0 nanometers, not greater than about 1.8 nanometers, not greater than about 1.6 nanometers, not greater than about 1.4 nanometers, not greater than about 1.2 nanometers, not greater than about 1.0 nanometers, not greater than about 0.8 nanometers, not greater than about 0.6 nanometers, not greater than about 0.5 nanometers, not greater than about 0.4 nanometers, not greater than about 0.3 nanometers or even not greater than about 0.2 nanometers. According to yet another embodiment, the second titanium blocker layer 136 may have a thickness of at least about 0.1 nanometers, such as, at least about 0.2 nanometers, at least about 0.3 nanometers, at least about 0.4 nanometers. It will be appreciated that the second titanium blocker layer 136 may have a thickness within a range between any of minimum and maximum values noted above. It will be further appreciated that the second titanium blocker layer 136 may have a thickness of any value between any of the minimum and maximum values noted above.

According to particular embodiments, the second functional layer 174 may include silver. According to yet another embodiment, the second functional layer 174 may consist essentially of silver. According to still another embodiment, the second functional layer 174 may be a silver layer.

According to still other embodiments, the second functional layer 174 may have a particular thickness. For example, the second functional layer 174 may have a thickness of at least about 5 nanometers, such as, at least about 6 nanometers, at least about 7 nanometers, at least about 8 nanometers, at least about 9 nanometers, at least about 10 nanometers, at least about 12 nanometers, at least about 14 nanometers, at least about 16 nanometers, at least about 18 nanometers, at least about 20 nanometers, at least about 25 nanometers, at least about 30 nanometers or even at least about 35 nanometers. According to still another embodiment, the second functional layer 174 may have a thickness of not greater than about 40 nanometers, such as, not greater than about 39 nanometers, not greater than about 38 nanometers, not greater than about 37 nanometers, not greater than about 36 nanometers, not greater than about 35 nanometers, not greater than about 34 nanometers, not greater than about 33 nanometers, not greater than about 32 nanometers or even not greater than about 31 nanometers. It will be appreciated that the second functional layer 174 may have a thickness within a range between any of minimum and maximum values noted above. It will be further appreciated that second functional layer 174 may have a thickness of any value between any of the minimum and maximum values noted above.

According to another embodiment, the third titanium blocker layer 172 may include titanium. According to still another embodiment, the third titanium blocker layer 172 may consist essentially of titanium. According to yet another embodiment, the third titanium blocker layer 172 may be referred to as a titanium layer.

According to still another embodiment, the third titanium blocker layer 172 may have a particular thickness. For example, the third titanium blocker layer 172 may have a thickness of not greater than about 10 nanometers, such as, not greater than about 9 nanometers, not greater than about 8 nanometers, not greater than about 7 nanometers, not greater than about 6 nanometers, not greater than about 5 nanometers, not greater than about 4.5 nanometers, not greater than about 4 nanometers, not greater than about 3.5 nanometers, not greater than about 3 nanometers, not greater than about 2.8 nanometers, not greater than about 2.6 nanometers, not greater than about 2.4 nanometers, not greater than about 2.2 nanometers, not greater than about 2.0 nanometers, not greater than about 1.8 nanometers, not greater than about 1.6 nanometers, not greater than about 1.4 nanometers, not greater than about 1.2 nanometers, not greater than about 1.0 nanometers, not greater than about 0.8 nanometers, not greater than about 0.6 nanometers, not greater than about 0.5 nanometers, not greater than about 0.4 nanometers, not greater than about 0.3 nanometers or even not greater than about 0.2 nanometers. According to yet another embodiment, the third titanium blocker layer 172 may have a thickness of at least about 0.1 nanometers, such as, at least about 0.2 nanometers, at least about 0.3 nanometers, at least about 0.4 nanometers. It will be appreciated that the third titanium blocker layer 172 may have a thickness within a range between any of minimum and maximum values noted above. It will be further appreciated the third titanium blocker layer 172 may have a thickness of any value between any of the minimum and maximum values noted above.

According to another embodiment, the fourth titanium blocker layer 176 may include titanium. According to still another embodiment, the fourth titanium blocker layer 176 may consist essentially of titanium. According to yet another embodiment, the fourth titanium blocker layer 176 may be referred to as a titanium layer.

According to still another embodiment, the fourth titanium blocker layer 176 may have a particular thickness. For example, the fourth titanium blocker layer 176 may have a thickness of not greater than about 10 nanometers, such as, not greater than about 9 nanometers, not greater than about 8 nanometers, not greater than about 7 nanometers, not greater than about 6 nanometers, not greater than about 5 nanometers, not greater than about 4.5 nanometers, not greater than about 4 nanometers, not greater than about 3.5 nanometers, not greater than about 3 nanometers, not greater than about 2.8 nanometers, not greater than about 2.6 nanometers, not greater than about 2.4 nanometers, not greater than about 2.2 nanometers, not greater than about 2.0 nanometers, not greater than about 1.8 nanometers, not greater than about 1.6 nanometers, not greater than about 1.4 nanometers, not greater than about 1.2 nanometers, not greater than about 1.0 nanometers, not greater than about 0.8 nanometers, not greater than about 0.6 nanometers, not greater than about 0.5 nanometers, not greater than about 0.4 nanometers, not greater than about 0.3 nanometers or even not greater than about 0.2 nanometers. According to yet another embodiment, the fourth titanium blocker layer 176 may have a thickness of at least about 0.1 nanometers, such as, at least about 0.2 nanometers, at least about 0.3 nanometers, at least about 0.4 nanometers. It will be appreciated that the fourth titanium blocker layer 176 may have a thickness within a range between any of minimum and maximum values noted above. It will be further appreciated that the fourth titanium blocker layer 176 may have a thickness of any value between any of the minimum and maximum values.

According to certain embodiments, the first dielectric layer 150 may include a dielectric material. According to still other embodiments, the first dielectric layer 150 may consist essentially of a dielectric material. The dielectric material of the first dielectric layer 150 may be any known transparent dielectric material, such as, any one of ITO, $SnZnO_x$, $SiO_x$, $Si_3N_4$, $Nb_2O_x$, $TiO_x$, $In_2O_x$, $ZnO_x$ or AZO. According to certain embodiments, the first dielectric layer 150 may include any one of ITO, $SnZnO_x$, $SiO_x$, $Si_3N_4$, $Nb_2O_x$, $TiO_x$, $In_2O_x$, $ZnO_x$ or AZO. According to still other embodiments, the first dielectric layer 150 may consist essentially of any one of ITO, $SnZnO_x$, $SiO_x$, $Si_3N_4$, $Nb_2O_x$, $TiO_x$, $In_2O_x$, $ZnO_x$ or AZO According to yet another embodiment, the first dielectric layer 150 may have a particular thickness. For example, the first dielectric layer 150 may have a thickness of not greater than about 200 nanometers, such as, not greater than about 190 nanometers, not greater than about 180 nanometers, not greater than about 170 nanometers, not greater than about 160 nanometers, not greater than about 150 nanometers, not greater than about 140 nanometers, not greater than about 130 nanometers, not greater than about 120 nanometers, not greater than about 110 nanometers, not greater than about 100 nanometers, not greater than about 95 nanometers, not greater than about 90 nanometers, not greater than about 85 nanometers, not greater than about 80 nanometers, not greater than about 75 nanometers, not greater than about 70 nanometers, not greater than about 65 nanometers, not greater than about 60 nanometers, not greater than about 55 nanometers, not greater than about 50 nanometers, not greater than about 45 nanometers, not greater than about 40 nanometers, not greater than about 35 nanometers, not greater than about 30 nanometers, not greater than about 30 nanometers, not greater than about 25 nanometers, not greater than about 20 nanometers or even not greater than about 15. According to still another embodiment, the first dielectric layer 150 may have a thickness of at least about 3 nanometers, such as, at least about 5 nanometers, at least about 8 nanometers, at least about 10 nanometers, at least about 20 nanometers, at least about 25 nanometers or even at least about 30 nanometers. It will be appreciated that the first dielectric layer 150 may have a thickness within a range between any of minimum and maximum values noted above. It will be further appreciated that the first dielectric layer 150 may have a thickness of any value between any of the minimum and maximum values noted above.

It will be appreciated that the first dielectric layer 150 may include multiple dielectric layers. It will be further appreciated that any dielectric layer making up the first dielectric layer 150 may have any of the characteristics described herein in reference to the first dielectric layer 150.

According to yet another embodiment, the composite film 100 may have a particular thickness ratio $TH_{BL1}/TH_{FL1}$, where $TH_{BL1}$ is the thickness of the first titanium blocker layer 132 and $TH_{FL1}$ is the thickness of the first functional layer 134. For example, the composite film 100 may have a ratio $TH_{BL1}/TH_{FL1}$ of not greater than about 0.5, such as, not greater than about 0.45, not greater than about 0.4, not greater than about 0.35, not greater than about 0.3, not greater than about 0.25, not greater than about 0.2, not greater than about 0.15, not greater than about 0.1 or even not greater than about 0.05. According to still another embodiment, the composite film 100 may have a ratio $TH_{BL1}/TH_{FL1}$ of at least about 0.01, such as, at least about 0.02, at least about 0.03, at least about 0.04, at least about 0.05, at least about 0.06, at least about 0.07, at least about 0.08, at least about 0.09 or even at least about 0.1. It will be appreciated that the composite film 100 may have a ratio $TH_{BL1}/TH_{FL1}$ of any value within a range between any of minimum and maximum values noted above. It will be further appreciated that the composite film 100 may have a ratio $TH_{BL1}/TH_{FL1}$ of any value between any of the minimum and maximum values noted above.

According to yet another embodiment, the composite film 100 may have a particular thickness ratio $TH_{BL2}/TH_{FL1}$, where $TH_{BL2}$ is the thickness of the second titanium blocker layer 136 and $TH_{FL1}$ is the thickness of the first functional layer 134. For example, the composite film 100 may have a ratio $TH_{BL2}/TH_{FL1}$ of not greater than about 0.5, such as, not greater than about 0.45, not greater than about 0.4, not greater than about 0.35, not greater than about 0.3, not greater than about 0.25, not greater than about 0.2, not greater than about 0.15, not greater than about 0.1 or even not greater than about 0.05. According to still another embodiment, the composite film 100 may have a ratio $TH_{BL2}/TH_{FL1}$ of at least about 0.01, such as, at least about 0.02, at least about 0.03, at least about 0.04, at least about 0.05, at least about 0.06, at least about 0.07, at least about 0.08, at least about 0.09 or even at least about 0.1. It will be appreciated that the composite film 100 may have a ratio $TH_{BL2}/TH_{FL1}$ of any value within a range between any of minimum and maximum values noted above. It will be further appreciated that the composite film 100 may have a ratio $TH_{BL2}/TH_{FL1}$ of any value between any of the minimum and maximum values noted above.

According to yet another embodiment, the composite film 100 may have a particular thickness ratio $TH_{BL3}/TH_{FL2}$, where $TH_{BL3}$ is the thickness of the third titanium blocker layer 172 and $TH_{FL2}$ is the thickness of the second functional layer 174. For example, the composite film 100 may have a ratio $TH_{BL3}/TH_{FL2}$ of not greater than about 0.5, such as, not greater than about 0.45, not greater than about 0.4, not greater than about 0.35, not greater than about 0.3, not greater than about 0.25, not greater than about 0.2, not greater than about 0.15, not greater than about 0.1 or even not greater than about 0.05. According to still another embodiment, the composite film 100 may have a ratio $TH_{BL3}/TH_{FL2}$ of at least about 0.01, such as, at least about 0.02, at least about 0.03, at least about 0.04, at least about 0.05, at least about 0.06, at least about 0.07, at least about 0.08, at least about 0.09 or even at least about 0.1. It will be appreciated that the composite film 100 may have a ratio $TH_{BL3}/TH_{FL2}$ of any value within a range between any of minimum and maximum values noted above. It will be further appreciated that the composite film 100 may have a ratio $TH_{BL3}/TH_{FL2}$ of any value between any of the minimum and maximum values noted above.

According to yet another embodiment, the composite film 100 may have a particular thickness ratio $TH_{BL4}/TH_{FL2}$, where $TH_{BL4}$ is the thickness of the fourth titanium blocker layer 176 and $TH_{FL2}$ is the thickness of the second functional layer 174. For example, the composite film 100 may have a ratio $TH_{BL4}/TH_{FL2}$ of not greater than about 0.5, such as, not greater than about 0.45, not greater than about 0.4, not greater than about 0.35, not greater than about 0.3, not greater than about 0.25, not greater than about 0.2, not greater than about 0.15, not greater than about 0.1 or even not greater than about 0.05. According to still another embodiment, the composite film 100 may have a ratio $TH_{BL4}/TH_{FL2}$ of at least about 0.01, such as, at least about 0.02, at least about 0.03, at least about 0.04, at least about 0.05, at least about 0.06, at least about 0.07, at least about 0.08, at least about 0.09 or even at least about 0.1. It will be appreciated that the composite film 100 may have a ratio $TH_{BL4}/TH_{FL2}$ of any value within a range between any of minimum and maximum values noted above. It will be further appreciated that the composite film 100 may have a ratio $TH_{BL4}/TH_{FL2}$ of any value between any of the minimum and maximum values noted above.

According to yet other embodiments, the composite film 100 may have a particular VLT. For example, the composite stack 100 may have a VLT of at least about 10%, at least about 15%, at least about 20%, at leas about 25%, at least about 30%, at least about 35%, at least about 40%, at least about 45%, at least about 50%, at least about 55%, at least about 60%, at least about 65%, at least about 70%, at least about 75%, at least about 80%, at least about 85% at least about 85% or even at least about 90%. According to still another embodiment, the composite film 100 may have a VLT of not greater than about 99%. It will be appreciated that the composite film 100 may have a VLT within a range between any of minimum and maximum values noted above. It will be further appreciated that the composite film 100 have a VLT of any value between any of the minimum and maximum values noted above.

According to still another embodiment, the composite film 100 may have a particular TSER. For example, the composite film 100 may have a TSER of at least about 60%, such as, at least about 62%, at least about 65%, at least about 67%, at least about 70%, at least about 72% or even at least about 75%. According to yet other embodiments, the composite film 100 may have a TSER of not greater than about 95%, such as, not greater than about 93%, not greater than about 90% or even not greater than about 88%. It will be appreciated that the composite film 100 may have a TSER within a range between any of minimum and maximum values noted above. It will be further appreciated that the composite film 100 may have a TSER of any value between any of the minimum and maximum values noted above.

According to yet other embodiments, the composite film 100 may have a particular Solar Control Ratio VLT/(100%-TSER). For example, the composite film 100 may have a Solar Control Ratio of at least about 0.45, such as, at least about 0.5, at least about 0.6, at least about 0.7, at least about 0.8, at least about 0.9, at least about 1.0, at least about 1.1, at least about 1.2, at least about 1.3, at least about 1.4 or even at least about 1.5. According to still other embodiments, the composite film 100 may have a Solar Control Ratio of not greater than about 2.0, such as, not greater than about 1.9, not greater than about 1.8, not greater than about 1.7 or even not greater than about 1.6. It will be appreciated that the composite film 100 may have a Solar Control Ratio within a range between any of minimum and maximum values noted above. It will be further appreciated that the composite film 100 may have a Solar Control Ratio of any value between any of the minimum and maximum values noted above.

According to still another embodiment, the composite film 100 may have a particular TTS. For example, the composite film 100 may have a TTS of not greater than about 50%, such as, not greater than about 45%, not greater than about 40%, not greater than about 35%, not greater than about 30%, not greater than about 29%, not greater than about 28%, not greater than about 27% or even not greater than about 26%. According to yet other embodiments, the composite film 100 may have a TTS of at least about 5%, such as, at least about 10% or even at least about 15%. It will be appreciated that the composite film 100 may have a TTS within a range between any of minimum and maximum values noted above. It will be further appreciated that the composite film 100 may have a TTS of any value between any of the minimum and maximum values noted above.

Figure 2A:
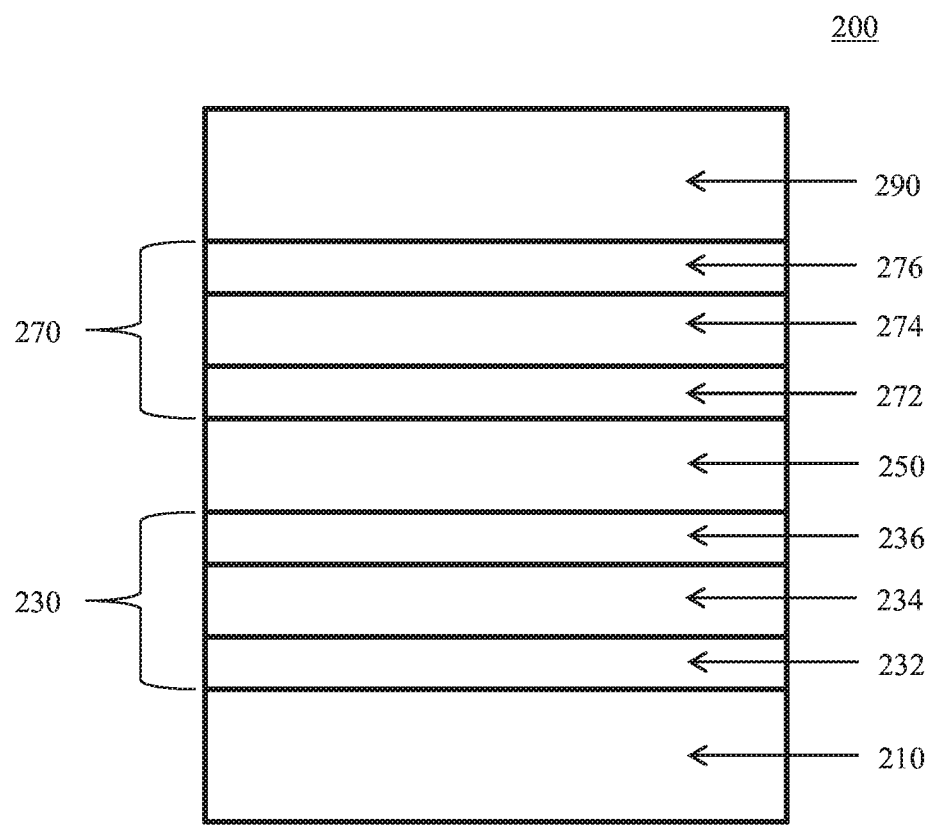
FIG. 2a includes an illustration of another example composite film according to certain embodiments described herein.

FIG. 2a includes an illustration of a cross-sectional view of a portion of another example composite film 200. As shown in FIG. 2a, the composite film 200 may include a first transparent substrate 210, a first infra-red reflection stack 230, a second infra-red reflection stack 270, a first dielectric layer 250 located between that first infra-red reflection stack 230 and the second infra-red reflection stack 270 and a second transparent substrate 290 located within the film so that the first infra-red reflection stack 230, the second infra-red reflection stack 270 and the first dielectric layer 250 are all located between the first transparent substrate 210 and the second transparent substrate 290. The first infra-red reflection stack 230 may include a first titanium blocker layer 232, the second titanium blocker layer 236 and a first functional layer 234. The first functional layer 234 may include silver. The second infra-red reflection stack 270 may include a third titanium blocker layer 272, a fourth titanium blocker layer 276 and a second functional layer 274. The second functional layer 274 may include silver.

It will be appreciated that the composite film 200 and all layers described in reference to the composite film 200 may have any of the characteristics described herein with reference to corresponding layers in FIG. 1.

According to particular embodiments, the second transparent substrate 290 may include a polymer material. According to another particular embodiment, the second transparent substrate 290 may consist of a polymer material. According to still other embodiments, the second transparent substrate 290 may be a polymer substrate layer. According to particular embodiments, the polymer substrate layer may include any desirable polymer material.

According to still other embodiments, the second transparent substrate 290 may include a polyethylene terephthalate (PET) material. According to another particular embodiment, the second transparent substrate 290 may consist of a PET material. According to still other embodiments, the second transparent substrate 290 may be a PET substrate layer. According to particular embodiments, the PET substrate layer may include any desirable polymer material.

According to yet another embodiment, the second transparent substrate 290 may include a glass material. According to yet another embodiment, the second transparent substrate 290 may consist of a glass material. According to still another embodiment, the second transparent substrate 290 may be a glass substrate layer. According to still other embodiments, the glass material may include any desirable glass material. According to still other embodiments, the glass substrate may have a VLT of at least about 85%, such as, at least about 86%, at least about 87% or even at least about 88%.

According to still other embodiments, when second transparent substrate 290 is a polymer substrate layer, it may have a particular thickness. For example, the second transparent substrate 290 may have a thickness of at least about 10 microns, such as, at least about 15 microns, at least about 20 microns, at least about 25 microns, at least about 30 microns, at least about 35 microns, at least about 40 microns, at least about 45 microns, at least about 50 microns, at least about 75 microns, at least about 100 micron or even at least about 125 microns. According to still another embodiment, the second transparent substrate 290 may have a thickness of not greater than about 250 microns, such as, not greater than about 245 microns, not greater than about 240 microns, not greater than about 235 microns, not greater than about 230 microns, not greater than about 225 microns, not greater than about 220 microns, not greater than about 215 microns, not greater than about 210 microns, not greater than about 205 microns, not greater than about 200 microns, not greater than about 175 microns or even not greater than about 150 microns. It will be appreciated that second transparent substrate 290 may have a thickness within a range between any of minimum and maximum values noted above. It will be further appreciated that second transparent substrate 290 may have a thickness of any value between any of the minimum and maximum values noted above.

Figure 2B:
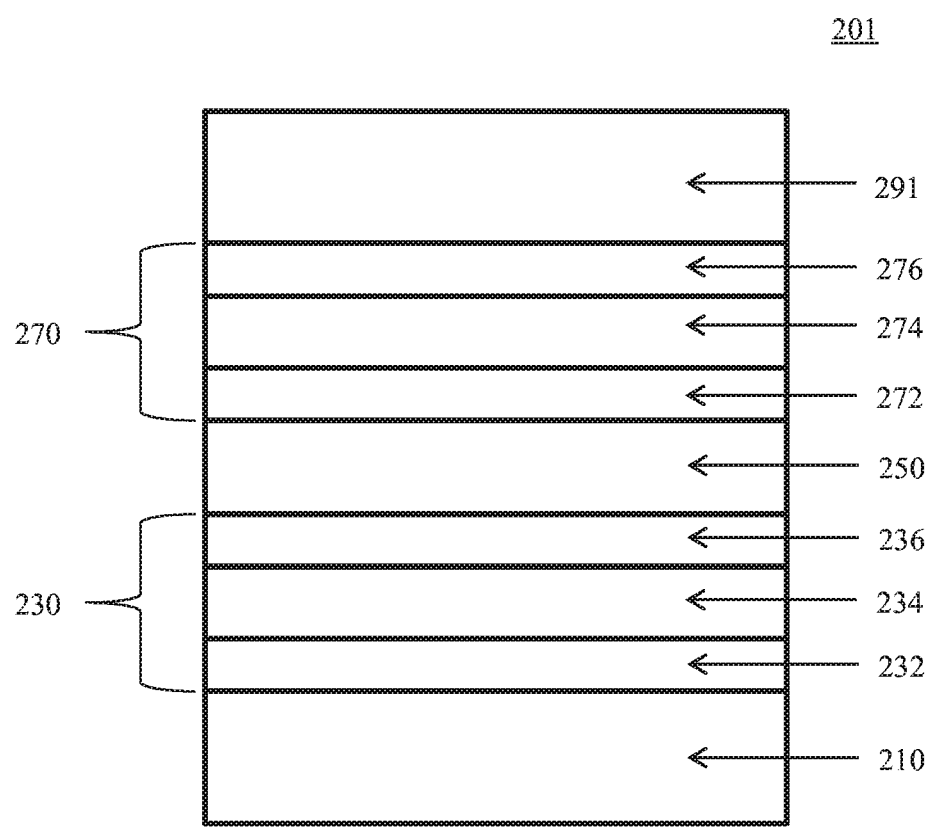
FIG. 2b includes an illustration of another example composite film according to certain embodiments described herein.

FIG. 2b includes an illustration of a cross-sectional view of a portion of another example composite film 201. As shown in FIG. 2b, the composite film 201 may include a first transparent substrate 210, a first infra-red reflection stack 230, a second infra-red reflection stack 270, a first dielectric layer 250 located between that first infra-red reflection stack 230 and the second infra-red reflection stack 270 and a first polyvinyl butyral (PVB) substrate 291 located within the film so that the first infra-red reflection stack 230, the second infra-red reflection stack 270 and the first dielectric layer 250 are all located between the first transparent substrate 210 and the first PVB substrate 291. The first infra-red reflection stack 230 may include a first titanium blocker layer 232, the second titanium blocker layer 236 and a first functional layer 234. The first functional layer 234 may include silver. The second infra-red reflection stack 270 may include a third titanium blocker layer 272, a fourth titanium blocker layer 276 and a second functional layer 274. The second functional layer 274 may include silver.

It will be appreciated that the composite film 201 and all layers described in reference to the composite film 201 may have any of the characteristics described herein with reference to corresponding layers in FIGS. 1 and 2a.

According to particular embodiments, the first PVB substrate 291 may comprise a clear PVB material. For purposes of embodiments described herein, a clear PVB material may be defined as a PVB material that does not dye or material darkening agent. According to still other embodiments the first PVB substrate 291 may consist of a clear PVB material. According to yet other embodiments, the first PVB substrate 291 may be a first clear PVB substrate 291. According to still another embodiment, the first PVB substrate 291 may have a VLT of at least about 85%, such as, at least about 86%, at least about 87% or even at least about 88%.

Figure 2C:
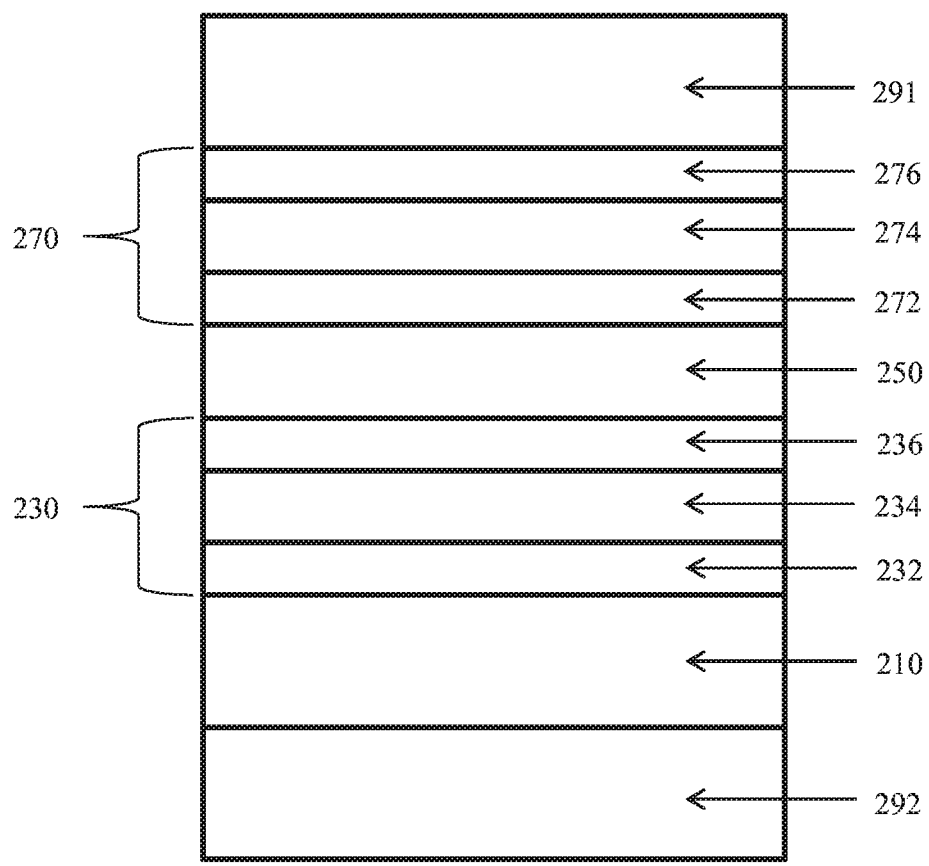
FIG. 2c includes an illustration of another example composite film according to certain embodiments described herein.

FIG. 2c includes an illustration of a cross-sectional view of a portion of another example composite film 202. As shown in FIG. 2c, the composite film 202 may include a first transparent substrate 210, a first infra-red reflection stack 230, a second infra-red reflection stack 270, a first dielectric layer 250 located between that first infra-red reflection stack 230 and the second infra-red reflection stack 270, a first polyvinyl butyral (PVB) substrate 291 and a second PVB substrate 292 located within the film so that the first infra-red reflection stack 230, the second infra-red reflection stack 270, the first dielectric layer 250 and the first transparent substrate 210 are all located between the first PVB substrate 291 and the second PVB substrate 292. The first infra-red reflection stack 230 may include a first titanium blocker layer 232, the second titanium blocker layer 236 and a first functional layer 234. The first functional layer 234 may include silver. The second infra-red reflection stack 270 may include a third titanium blocker layer 272, a fourth titanium blocker layer 276 and a second functional layer 274. The second functional layer 274 may include silver.

It will be appreciated that the composite film 202 and all layers described in reference to the composite film 202 may have any of the characteristics described herein with reference to corresponding layers in FIGS. 1, 2a and 2b.

According to particular embodiments, the second PVB substrate 292 may comprise a clear PVB material. For purposes of embodiments described herein, a clear PVB material may be defined as a PVB material that does not dye or material darkening agent. According to still other embodiments the second PVB substrate 292 may consist of a clear PVB material. According to yet other embodiments, the second PVB substrate 292 may be a second clear PVB substrate 292. According to still another embodiment, the second PVB substrate 292 may have a VLT of at least about 85%, such as, at least about 86%, at least about 87% or even at least about 88%.

Figure 2D:
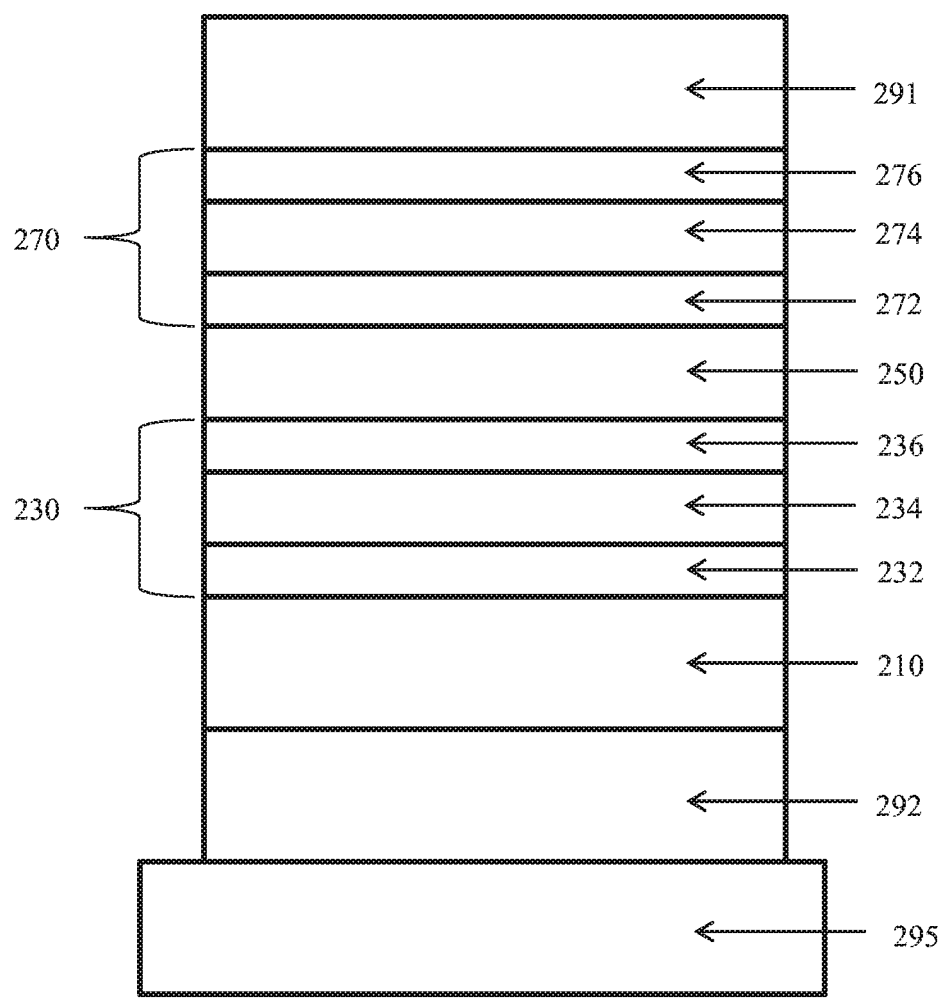
FIG. 2d includes an illustration of another example composite film according to certain embodiments described herein.

FIG. 2d includes an illustration of a cross-sectional view of a portion of another example composite film 203. As shown in FIG. 2d, the composite film 202 may include a first transparent substrate 210, a first infra-red reflection stack 230, a second infra-red reflection stack 270, a first dielectric layer 250 located between that first infra-red reflection stack 230 and the second infra-red reflection stack 270, a first polyvinyl butyral (PVB) substrate 291, a second PVB substrate 292 and a first glass substrate 295 located within the film so that the first infra-red reflection stack 230, the second infra-red reflection stack 270, the first dielectric layer 250, the first transparent substrate 210 and the second PVB substrate 292 are all located between the first PVB substrate 291 and the first glass substrate 295. The first infra-red reflection stack 230 may include a first titanium blocker layer 232, the second titanium blocker layer 236 and a first functional layer 234. The first functional layer 234 may include silver. The second infra-red reflection stack 270 may include a third titanium blocker layer 272, a fourth titanium blocker layer 276 and a second functional layer 274. The second functional layer 274 may include silver.

It will be appreciated that the composite film 203 and all layers described in reference to the composite film 203 may have any of the characteristics described herein with reference to corresponding layers in FIGS. 1, 2a, 2b and 2c.

According to particular embodiments, the first glass substrate 295 may comprise a dark glass material. According to still other embodiments the first glass substrate 295 may consist of a dark glass material. According to yet other embodiments, the first glass substrate 295 may be a first dark glass substrate 295.

According to still another embodiment, the first glass substrate 295 is a first dark glass substrate, the first glass substrate 295 may have a VLT of at least about 10%, such as, at least about 15%, at least about 20% or even at least about 30%. According to still another embodiment, first glass substrate 295 may have a VLT of not greater than about 50%, such as, not greater than about 45%, not greater than about 40% or even not greater than about 35%. It will be appreciated that the first glass substrate 295 may have a VLT within a range between any of minimum and maximum values noted above. It will be further appreciated that the first glass substrate 295 may have a VLT of any value between any of the minimum and maximum values noted above.

Figure 3:
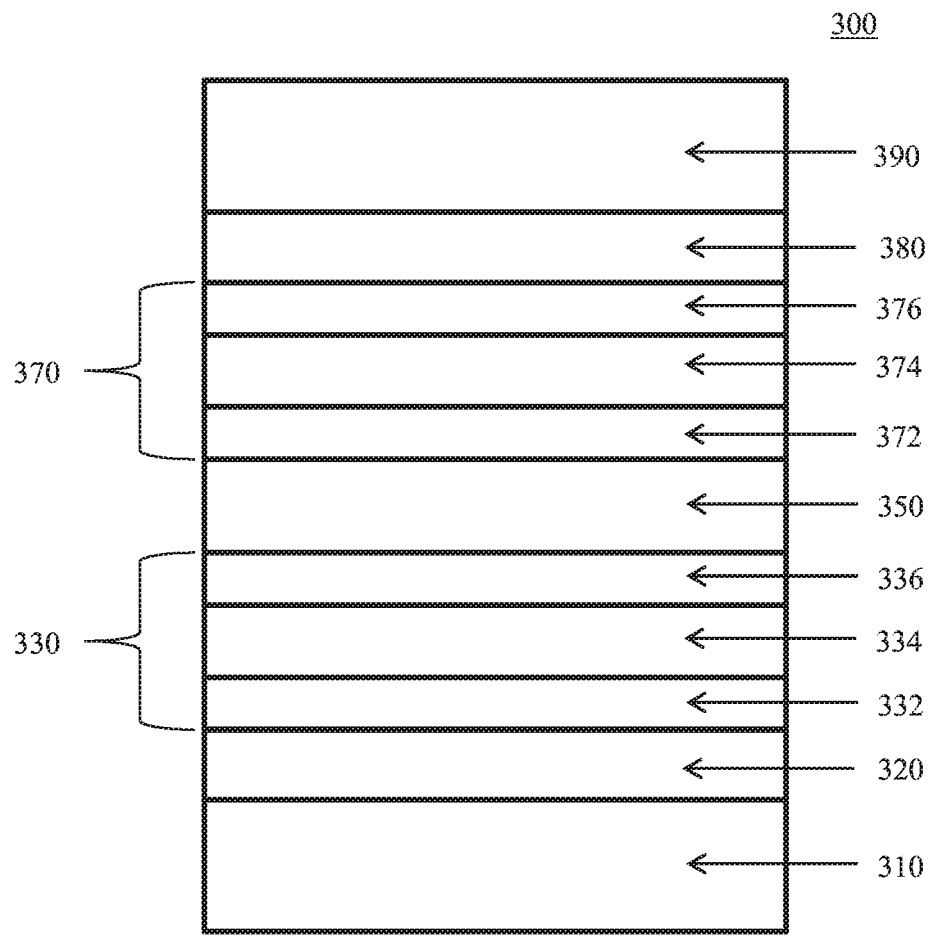
FIG. 3 includes an illustration of another example composite film according to certain embodiments described herein FIG. 4 includes an illustration of another example composite film according to certain embodiments described herein.

FIG. 3 includes an illustration of a cross-sectional view of a portion of another example composite film 300.

As shown in FIG. 3, the composite film 300 may include a first transparent substrate 310, a first infra-red reflection stack 330, a second infra-red reflection stack 370, a first dielectric layer 350 located between that first infra-red reflection stack 330 and the second infra-red reflection stack 370, a second dielectric layer 320 located so that the first infra-red reflection stack 330 is located between the first dielectric layer 350 and the second dielectric layer 320, a third dielectric layer 380 located so that the second infra-red stack 370 is located between the first dielectric layer 350 and the third dielectric layer 380 and a second transparent substrate 390 located within the composite film 300 so that the first infra-red reflection stack 330, the second infra-red reflection stack 370, the first dielectric layer 350, the second dielectric layer 320 and the third dielectric layer 380 are all located between the first transparent substrate 310 and the second transparent substrate 390. The first infra-red reflection stack 330 may include a first titanium blocker layer 332, the second titanium blocker layer 336 and a first functional layer 334. The first functional layer 334 may include silver. The second infra-red reflection stack 370 may include a third titanium blocker layer 372, a fourth titanium blocker layer 376 and a second functional layer 374. The second functional layer 374 may include silver.

It will be appreciated that the composite film 300 and all layers described in reference to the composite film 300 may have any of the characteristics described herein with reference to corresponding layers in FIG. 1, 2a, 2b, 2c or 2d.

According to certain embodiments, the second dielectric layer 320 may include a dielectric material. According to still other embodiments, the second dielectric layer 320 may consist essentially of a dielectric material. The dielectric material of the second dielectric layer 320 may be any known transparent dielectric material, such as, any one of ITO, $SnZnO_x$, $SiO_x$, $Si_3N_4$, $Nb_2O_x$, $TiO_x$, $In_2O_x$, $ZnO_x$ or AZO. According to certain embodiments, the second dielectric layer 320 may include any one of ITO, $SnZnO_x$, $SiO_x$, $Si_3N_4$, $Nb_2O_x$, $TiO_x$, $In_2O_x$, $ZnO_x$ or AZO. According to still other embodiments, the second dielectric layer 320 may consist essentially of any one of ITO, $SnZnO_x$, $SiO_x$, $Si_3N_4$, $Nb_2O_x$, $TiO_x$, $In_2O_x$, $ZnO_x$ or AZO.

According to yet another embodiment, the second dielectric layer 320 may have a particular thickness. For example, the second dielectric layer 320 may have a thickness of not greater than about 200 nanometers, such as, not greater than about 190 nanometers, not greater than about 180 nanometers, not greater than about 170 nanometers, not greater than about 160 nanometers, not greater than about 150 nanometers, not greater than about 140 nanometers, not greater than about 130 nanometers, not greater than about 120 nanometers, not greater than about 110 nanometers, not greater than about 100 nanometers, not greater than about 95 nanometers, not greater than about 90 nanometers, not greater than about 85 nanometers, not greater than about 80 nanometers, not greater than about 75 nanometers, not greater than about 70 nanometers, not greater than about 65 nanometers, not greater than about 60 nanometers, not greater than about 55 nanometers, not greater than about 50 nanometers, not greater than about 45 nanometers, not greater than about 40 nanometers, not greater than about 35 nanometers, not greater than about 30 nanometers, not greater than about 30 nanometers, not greater than about 25 nanometers, not greater than about 20 nanometers or even not greater than about 15. According to still another embodiment, the second dielectric layer 320 may have a thickness of at least about 3 nanometers, such as, at least about 5 nanometers, at least about 8 nanometers, at least about 10 nanometers, at least about 20 nanometers, at least about 25 nanometers or even at least about 30 nanometers. It will be appreciated that the second dielectric layer 320 may have a thickness within a range between any of minimum and maximum values noted above. It will be further appreciated that the second dielectric layer 320 may have a thickness of any value between any of the minimum and maximum values noted above.

It will be appreciated that the second dielectric layer 320 may include multiple dielectric layers. It will be further appreciated that any dielectric layer making up the second dielectric layer 320 may have any of the characteristics described herein in reference to the second dielectric layer 320.

According to certain embodiments, the third dielectric layer 380 may include a dielectric material. According to still other embodiments, the third dielectric layer 380 may consist essentially of a dielectric material. The dielectric material of the third dielectric layer 380 may be any known transparent dielectric material, such as, any one of ITO, $SnZnO_x$, $SiO_x$, $Si_3N_4$, $Nb_2O_x$, $TiO_x$, $In_2O_x$, $ZnO_x$ or AZO. According to certain embodiments, the third dielectric layer 380 may include any one of ITO, $SnZnO_x$, $SiO_x$, $Si_3N_4$, $Nb_2O_x$, $TiO_x$, $In_2O_x$, $ZnO_x$ or AZO. According to still other embodiments, the third dielectric layer 380 may consist essentially of any one of ITO, $SnZnO_x$, $SiO_x$, $Si_3N_4$, $Nb_2O_x$, $TiO_x$, $In_2O_x$, $ZnO_x$ or AZO.

According to yet another embodiment, the third dielectric layer 380 may have a particular thickness. For example, the third dielectric layer 380 may have a thickness of not greater than about 200 nanometers, such as, not greater than about 190 nanometers, not greater than about 180 nanometers, not greater than about 170 nanometers, not greater than about 160 nanometers, not greater than about 150 nanometers, not greater than about 140 nanometers, not greater than about 130 nanometers, not greater than about 120 nanometers, not greater than about 110 nanometers, not greater than about 100 nanometers, not greater than about 95 nanometers, not greater than about 90 nanometers, not greater than about 85 nanometers, not greater than about 80 nanometers, not greater than about 75 nanometers, not greater than about 70 nanometers, not greater than about 65 nanometers, not greater than about 60 nanometers, not greater than about 55 nanometers, not greater than about 50 nanometers, not greater than about 45 nanometers, not greater than about 40 nanometers, not greater than about 35 nanometers, not greater than about 30 nanometers, not greater than about 30 nanometers, not greater than about 25 nanometers, not greater than about 20 nanometers or even not greater than about 15. According to still another embodiment, the third dielectric layer 380 may have a thickness of at least about 3 nanometers, such as, at least about 5 nanometers, at least about 8 nanometers, at least about 10 nanometers, at least about 20 nanometers, at least about 25 nanometers or even at least about 30 nanometers. It will be appreciated that the third dielectric layer 380 may have a thickness within a range between any of minimum and maximum values noted above. It will be further appreciated that the third dielectric layer 380 may have a thickness of any value between any of the minimum and maximum values noted above.

It will be appreciated that the third dielectric layer 380 may include multiple dielectric layers. It will be further appreciated that any dielectric layer making up the third dielectric layer 380 may have any of the characteristics described herein in reference to the third dielectric layer 380.

Figure 4:
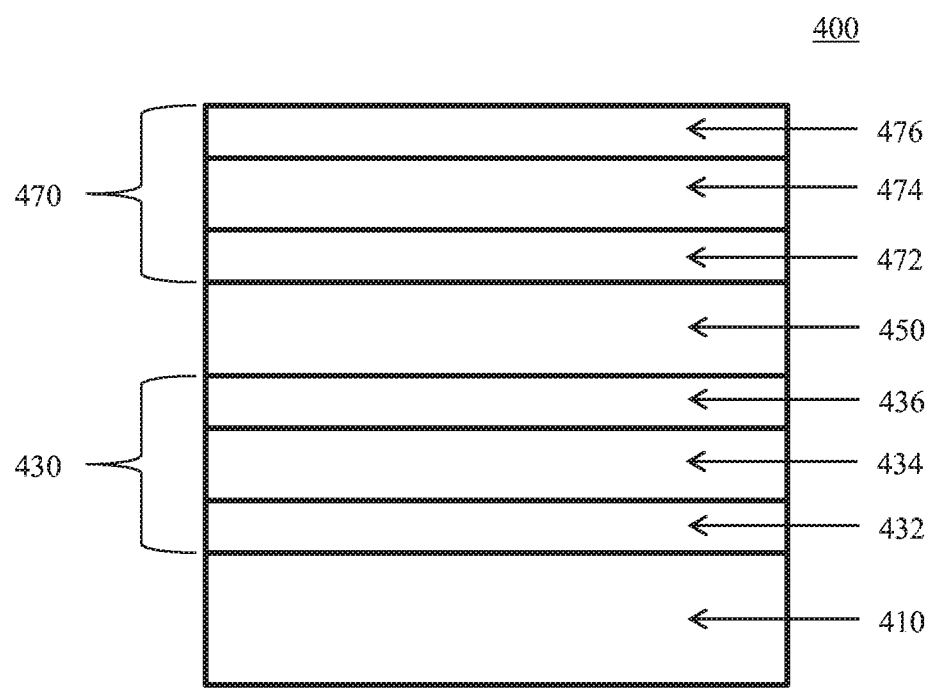

FIG. 4 includes an illustration of a cross-sectional view of a portion of an example composite film 400. As shown in FIG. 4, the composite film 400 may include a first transparent substrate 410, a first infra-red reflection stack 430, a second infra-red reflection stack 470 and a first dielectric layer 450 located between that first infra-red reflection stack 430 and the second infra-red reflection stack 470. The first infra-red reflection stack 430 may include a first titanium blocker layer 432, a second titanium blocker layer 436 and a first functional layer 434. The first titanium blocker layer 432 may have a thickness of at least about 0.2 nm and not greater than about 5 nm. The second titanium blocker layer 436 may have a thickness of at least about 0.2 nm and not greater than about 5 nm. The first functional layer 434 may include silver. The second infra-red reflection stack 470 may include a third titanium blocker layer 472, a fourth titanium blocker layer 476 and a second functional layer 474. The third titanium blocker layer 472 may have a thickness of at least about 0.2 nm and not greater than about 5 nm. The fourth titanium blocker layer 476 may have a thickness of at least about 0.2 nm and not greater than about 5 nm. The second functional layer 474 may include silver.

According to particular embodiments, the first transparent substrate 410 may include a polymer material. According to another particular embodiment, the first transparent substrate 410 may consist of a polymer material. According to still other embodiments, the first transparent substrate 410 may be a polymer substrate layer. According to particular embodiments, the polymer substrate layer may include any desirable polymer material.

According to still other embodiments, the first transparent substrate 410 may include a polyethylene terephthalate (PET) material. According to another particular embodiment, the first transparent substrate 410 may consist of a PET material. According to still other embodiments, the first transparent substrate 410 may be a PET substrate layer. According to particular embodiments, the PET substrate layer may include any desirable polymer material.

According to yet another embodiment, the first transparent substrate 410 may include a glass material. According to yet another embodiment, the first transparent substrate 410 may consist of a glass material. According to still another embodiment, the first transparent substrate 410 may be a glass substrate layer. According to still other embodiments, the glass material may include any desirable glass material. According to still other embodiments, the glass substrate may have a VLT of at least about 85%, such as, at least about 86%, at least about 87% or even at least about 88%.

According to still other embodiments, when the first transparent substrate 410 is a polymer substrate layer, it may have a particular thickness. For example, the first transparent substrate 410 may have a thickness of at least about 10 microns, such as, at least about 15 microns, at least about 20 microns, at least about 25 microns, at least about 30 microns, at least about 35 microns, at least about 40 microns, at least about 45 microns, at least about 50 microns, at least about 75 microns, at least about 100 micron or even at least about 125 microns. According to still another embodiment, the first transparent substrate 410 may have a thickness of not greater than about 250 microns, such as, not greater than about 245 microns, not greater than about 240 microns, not greater than about 235 microns, not greater than about 230 microns, not greater than about 225 microns, not greater than about 220 microns, not greater than about 215 microns, not greater than about 210 microns, not greater than about 205 microns, not greater than about 200 microns, not greater than about 175 microns or even not greater than about 150 microns. It will be appreciated that the first transparent substrate 410 may have a thickness within a range between any of minimum and maximum values noted above. It will be further appreciated that the first transparent substrate 410 may have a thickness of any value between any of the minimum and maximum values noted above.

It will be further appreciated that when the first transparent substrate 410 is a glass substrate layer, it may have any desired thickness.

According to particular embodiments, the first functional layer 434 may include silver. According to yet another embodiment, the first functional layer 434 may consist essentially of silver. According to still another embodiment, the first functional layer 434 may be a silver layer.

According to still other embodiments, the first functional layer 434 may have a particular thickness. For example, the first functional layer 434 may have a thickness of at least about 5 nanometers, such as, at least about 6 nanometers, at least about 7 nanometers, at least about 8 nanometers, at least about 9 nanometers, at least about 10 nanometers, at least about 12 nanometers, at least about 14 nanometers, at least about 16 nanometers, at least about 18 nanometers, at least about 20 nanometers, at least about 25 nanometers, at least about 30 nanometers or even at least about 35 nanometers. According to still another embodiment, the first functional layer 434 may have a thickness of not greater than about 40 nanometers, such as, not greater than about 39 nanometers, not greater than about 38 nanometers, not greater than about 37 nanometers, not greater than about 36 nanometers, not greater than about 35 nanometers, not greater than about 34 nanometers, not greater than about 33 nanometers, not greater than about 32 nanometers or even not greater than about 31 nanometers. It will be appreciated that the first functional layer 434 may have a thickness within a range between any of minimum and maximum values noted above. It will be further appreciated that first functional layer 434 may have a thickness of any value between any of the minimum and maximum values noted above.

According to another embodiment, the first titanium blocker layer 432 may include titanium. According to still another embodiment, the first titanium blocker layer 432 may consist essentially of titanium. According to yet another embodiment, the first titanium blocker layer 432 may be referred to as a titanium layer.

According to still another embodiment, the first titanium blocker layer 432 may have a particular thickness. For example, the first titanium blocker layer 432 may have a thickness of not greater than about 5 nanometers, such as, not greater than about 4.5 nanometers, not greater than about 4 nanometers, not greater than about 3.5 nanometers, not greater than about 3 nanometers, not greater than about 2.8 nanometers, not greater than about 2.6 nanometers, not greater than about 2.4 nanometers, not greater than about 2.2 nanometers, not greater than about 2.0 nanometers, not greater than about 1.8 nanometers, not greater than about 1.6 nanometers, not greater than about 1.4 nanometers, not greater than about 1.2 nanometers, not greater than about 1.0 nanometers, not greater than about 0.8 nanometers, not greater than about 0.6 nanometers, not greater than about 0.5 nanometers, not greater than about 0.4 nanometers, not greater than about 0.3 nanometers or even not greater than about 0.2 nanometers. According to yet another embodiment, the first titanium blocker layer 132 may have a thickness of at least about 0.1 nanometers, such as, at least about 0.2 nanometers, at least about 0.3 nanometers, at least about 0.4 nanometers. It will be appreciated that the first titanium blocker layer 432 may have a thickness within a range between any of minimum and maximum values noted above. It will be further appreciated the first titanium blocker layer 432 may have a thickness of any value between any of the minimum and maximum values noted above.

According to another embodiment, the second titanium blocker layer 436 may include titanium. According to still another embodiment, the second titanium blocker layer 436 may consist essentially of titanium. According to yet another embodiment, the second titanium blocker layer 436 may be referred to as a titanium layer.

According to still another embodiment, the second titanium blocker layer 436 may have a particular thickness. For example, the second titanium blocker layer 436 may have a thickness of not greater than about 5 nanometers, such as, not greater than about 4.5 nanometers, not greater than about 4 nanometers, not greater than about 3.5 nanometers, not greater than about 3 nanometers, not greater than about 2.8 nanometers, not greater than about 2.6 nanometers, not greater than about 2.4 nanometers, not greater than about 2.2 nanometers, not greater than about 2.0 nanometers, not greater than about 1.8 nanometers, not greater than about 1.6 nanometers, not greater than about 1.4 nanometers, not greater than about 1.2 nanometers, not greater than about 1.0 nanometers, not greater than about 0.8 nanometers, not greater than about 0.6 nanometers, not greater than about 0.5 nanometers, not greater than about 0.4 nanometers, not greater than about 0.3 nanometers or even not greater than about 0.2 nanometers. According to yet another embodiment, the second titanium blocker layer 436 may have a thickness of at least about 0.1 nanometers, such as, at least about 0.2 nanometers, at least about 0.3 nanometers, at least about 0.4 nanometers. It will be appreciated that the second titanium blocker layer 436 may have a thickness within a range between any of minimum and maximum values noted above. It will be further appreciated that the second titanium blocker layer 436 may have a thickness of any value between any of the minimum and maximum values noted above.

According to particular embodiments, the second functional layer 474 may include silver. According to yet another embodiment, the second functional layer 474 may consist essentially of silver. According to still another embodiment, the second functional layer 474 may be a silver layer.

According to still other embodiments, the second functional layer 474 may have a particular thickness. For example, the second functional layer 474 may have a thickness of at least about 5 nanometers, such as, at least about 6 nanometers, at least about 7 nanometers, at least about 8 nanometers, at least about 9 nanometers, at least about 10 nanometers, at least about 12 nanometers, at least about 14 nanometers, at least about 16 nanometers, at least about 18 nanometers, at least about 20 nanometers, at least about 25 nanometers, at least about 30 nanometers or even at least about 35 nanometers. According to still another embodiment, the second functional layer 474 may have a thickness of not greater than about 40 nanometers, such as, not greater than about 39 nanometers, not greater than about 38 nanometers, not greater than about 37 nanometers, not greater than about 36 nanometers, not greater than about 35 nanometers, not greater than about 34 nanometers, not greater than about 33 nanometers, not greater than about 32 nanometers or even not greater than about 31 nanometers. It will be appreciated that the second functional layer 474 may have a thickness within a range between any of minimum and maximum values noted above. It will be further appreciated that second functional layer 474 may have a thickness of any value between any of the minimum and maximum values noted above.

According to another embodiment, the third titanium blocker layer 472 may include titanium. According to still another embodiment, the third titanium blocker layer 472 may consist essentially of titanium. According to yet another embodiment, the third titanium blocker layer 472 may be referred to as a titanium layer.

According to still another embodiment, the third titanium blocker layer 472 may have a particular thickness. For example, the third titanium blocker layer 472 may have a thickness of not greater than about 5 nanometers, such as, not greater than about 4.5 nanometers, not greater than about 4 nanometers, not greater than about 3.5 nanometers, not greater than about 3 nanometers, not greater than about 2.8 nanometers, not greater than about 2.6 nanometers, not greater than about 2.4 nanometers, not greater than about 2.2 nanometers, not greater than about 2.0 nanometers, not greater than about 1.8 nanometers, not greater than about 1.6 nanometers, not greater than about 1.4 nanometers, not greater than about 1.2 nanometers, not greater than about 1.0 nanometers, not greater than about 0.8 nanometers, not greater than about 0.6 nanometers, not greater than about 0.5 nanometers, not greater than about 0.4 nanometers, not greater than about 0.3 nanometers or even not greater than about 0.2 nanometers. According to yet another embodiment, the third titanium blocker layer 472 may have a thickness of at least about 0.1 nanometers, such as, at least about 0.2 nanometers, at least about 0.3 nanometers, at least about 0.4 nanometers. It will be appreciated that the third titanium blocker layer 472 may have a thickness within a range between any of minimum and maximum values noted above. It will be further appreciated the third titanium blocker layer 472 may have a thickness of any value between any of the minimum and maximum values noted above.

According to another embodiment, the fourth titanium blocker layer 476 may include titanium. According to still another embodiment, the fourth titanium blocker layer 476 may consist essentially of titanium. According to yet another embodiment, the fourth titanium blocker layer 476 may be referred to as a titanium layer.

According to still another embodiment, the fourth titanium blocker layer 476 may have a particular thickness. For example, the fourth titanium blocker layer 476 may have a thickness of not greater than about 5 nanometers, such as, not greater than about 4.5 nanometers, not greater than about 4 nanometers, not greater than about 3.5 nanometers, not greater than about 3 nanometers, not greater than about 2.8 nanometers, not greater than about 2.6 nanometers, not greater than about 2.4 nanometers, not greater than about 2.2 nanometers, not greater than about 2.0 nanometers, not greater than about 1.8 nanometers, not greater than about 1.6 nanometers, not greater than about 1.4 nanometers, not greater than about 1.2 nanometers, not greater than about 1.0 nanometers, not greater than about 0.8 nanometers, not greater than about 0.6 nanometers, not greater than about 0.5 nanometers, not greater than about 0.4 nanometers, not greater than about 0.3 nanometers or even not greater than about 0.2 nanometers. According to yet another embodiment, the fourth titanium blocker layer 476 may have a thickness of at least about 0.1 nanometers, such as, at least about 0.2 nanometers, at least about 0.3 nanometers, at least about 0.4 nanometers. It will be appreciated that the fourth titanium blocker layer 476 may have a thickness within a range between any of minimum and maximum values noted above. It will be further appreciated that the fourth titanium blocker layer 476 may have a thickness of any value between any of the minimum and maximum values.

According to certain embodiments, the first dielectric layer 450 may include a dielectric material. According to still other embodiments, the first dielectric layer 450 may consist essentially of a dielectric material. The dielectric material of the first dielectric layer 450 may be any known transparent dielectric material, such as, any one of ITO, $SnZnO_x$, $SiO_x$, $Si_3N_4$, $Nb_2O_x$, $TiO_x$, $In_2O_x$, $ZnO_x$ or AZO. According to certain embodiments, the first dielectric layer 450 may include any one of ITO, $SnZnO_x$, $SiO_x$, $Si_3N_4$, $Nb_2O_x$, $TiO_x$, $In_2O_x$, $ZnO_x$ or AZO. According to still other embodiments, the first dielectric layer 450 may consist essentially of any one of ITO, $SnZnO_x$, $SiO_x$, $Si_3N_4$, $Nb_2O_x$, $TiO_x$, $In_2O_x$, $ZnO_x$ or AZO.

According to yet another embodiment, the first dielectric layer 450 may have a particular thickness. For example, the first dielectric layer 450 may have a thickness of not greater than about 200 nanometers, such as, not greater than about 190 nanometers, not greater than about 180 nanometers, not greater than about 170 nanometers, not greater than about 160 nanometers, not greater than about 150 nanometers, not greater than about 140 nanometers, not greater than about 130 nanometers, not greater than about 120 nanometers, not greater than about 110 nanometers, not greater than about 100 nanometers, not greater than about 95 nanometers, not greater than about 90 nanometers, not greater than about 85 nanometers, not greater than about 80 nanometers, not greater than about 75 nanometers, not greater than about 70 nanometers, not greater than about 65 nanometers, not greater than about 60 nanometers, not greater than about 55 nanometers, not greater than about 50 nanometers, not greater than about 45 nanometers, not greater than about 40 nanometers, not greater than about 35 nanometers, not greater than about 30 nanometers, not greater than about 30 nanometers, not greater than about 25 nanometers, not greater than about 20 nanometers or even not greater than about 15. According to still another embodiment, the first dielectric layer 450 may have a thickness of at least about 3 nanometers, such as, at least about 5 nanometers, at least about 8 nanometers, at least about 10 nanometers, at least about 20 nanometers, at least about 25 nanometers or even at least about 30 nanometers. It will be appreciated that the first dielectric layer 450 may have a thickness within a range between any of minimum and maximum values noted above. It will be further appreciated that the first dielectric layer 450 may have a thickness of any value between any of the minimum and maximum values noted above.

It will be appreciated that the first dielectric layer 450 may include multiple dielectric layers. It will be further appreciated that any dielectric layer making up the first dielectric layer 450 may have any of the characteristics described herein in reference to the first dielectric layer 450.

According to yet another embodiment, the composite film 400 may have a particular thickness ratio $TH_{BL1}/TH_{FL1}$, where $TH_{BL1}$ is the thickness of the first titanium blocker layer 432 and $TH_{FL1}$ is the thickness of the first functional layer 434. For example, the composite film 400 may have a ratio $TH_{BL1}/TH_{FL1}$ of not greater than about 0.5, such as, not greater than about 0.45, not greater than about 0.4, not greater than about 0.35, not greater than about 0.3, not greater than about 0.25, not greater than about 0.2, not greater than about 0.15, not greater than about 0.1 or even not greater than about 0.05. According to still another embodiment, the composite film 100 may have a ratio $TH_{BL1}/TH_{FL1}$ of at least about 0.01, such as, at least about 0.02, at least about 0.03, at least about 0.04, at least about 0.05, at least about 0.06, at least about 0.07, at least about 0.08, at least about 0.09 or even at least about 0.1. It will be appreciated that the composite film 400 may have a ratio $TH_{BL1}/TH_{FL1}$ of any value within a range between any of minimum and maximum values noted above. It will be further appreciated that the composite film 400 may have a ratio $TH_{BL1}/TH_{FL1}$ of any value between any of the minimum and maximum values noted above.

According to yet another embodiment, the composite film 400 may have a particular thickness ratio $TH_{BL2}/TH_{FL1}$, where $TH_{BL2}$ is the thickness of the second titanium blocker layer 436 and $TH_{FL1}$ is the thickness of the first functional layer 434. For example, the composite film 400 may have a ratio $TH_{BL2}/TH_{FL1}$ of not greater than about 0.5, such as, not greater than about 0.45, not greater than about 0.4, not greater than about 0.35, not greater than about 0.3, not greater than about 0.25, not greater than about 0.2, not greater than about 0.15, not greater than about 0.1 or even not greater than about 0.05. According to still another embodiment, the composite film 100 may have a ratio $TH_{BL2}/TH_{FL1}$ of at least about 0.01, such as, at least about 0.02, at least about 0.03, at least about 0.04, at least about 0.05, at least about 0.06, at least about 0.07, at least about 0.08, at least about 0.09 or even at least about 0.1. It will be appreciated that the composite film 400 may have a ratio $TH_{BL2}/TH_{FL1}$ of any value within a range between any of minimum and maximum values noted above. It will be further appreciated that the composite film 400 may have a ratio $TH_{BL2}/TH_{FL1}$ of any value between any of the minimum and maximum values noted above.

According to yet another embodiment, the composite film 400 may have a particular thickness ratio $TH_{BL3}/TH_{FL2}$, where $TH_{BL3}$ is the thickness of the third titanium blocker layer 472 and $TH_{FL2}$ is the thickness of the second functional layer 474. For example, the composite film 400 may have a ratio $TH_{BL3}/TH_{FL2}$ of not greater than about 0.5, such as, not greater than about 0.45, not greater than about 0.4, not greater than about 0.35, not greater than about 0.3, not greater than about 0.25, not greater than about 0.2, not greater than about 0.15, not greater than about 0.1 or even not greater than about 0.05. According to still another embodiment, the composite film 400 may have a ratio $TH_{BL3}/TH_{FL2}$ of at least about 0.01, such as, at least about 0.02, at least about 0.03, at least about 0.04, at least about 0.05, at least about 0.06, at least about 0.07, at least about 0.08, at least about 0.09 or even at least about 0.1. It will be appreciated that the composite film 400 may have a ratio $TH_{BL3}/TH_{FL2}$ of any value within a range between any of minimum and maximum values noted above. It will be further appreciated that the composite film 400 may have a ratio $TH_{BL3}/TH_{FL2}$ of any value between any of the minimum and maximum values noted above.

According to yet another embodiment, the composite film 400 may have a particular thickness ratio $TH_{BL4}/TH_{FL2}$, where $TH_{BL4}$ is the thickness of the fourth titanium blocker layer 476 and $TH_{FL2}$ is the thickness of the second functional layer 474. For example, the composite film 400 may have a ratio $TH_{BL4}/TH_{FL2}$ of not greater than about 0.5, such as, not greater than about 0.45, not greater than about 0.4, not greater than about 0.35, not greater than about 0.3, not greater than about 0.25, not greater than about 0.2, not greater than about 0.15, not greater than about 0.1 or even not greater than about 0.05. According to still another embodiment, the composite film 400 may have a ratio $TH_{BL4}/TH_{FL2}$ of at least about 0.01, such as, at least about 0.02, at least about 0.03, at least about 0.04, at least about 0.05, at least about 0.06, at least about 0.07, at least about 0.08, at least about 0.09 or even at least about 0.1. It will be appreciated that the composite film 400 may have a ratio $TH_{BL4}/TH_{FL2}$ of any value within a range between any of minimum and maximum values noted above. It will be further appreciated that the composite film 400 may have a ratio $TH_{BL4}/TH_{FL2}$ of any value between any of the minimum and maximum values noted above.

According to yet other embodiments, the composite film 400 may have a particular VLT. For example, the composite film 400 may have a VLT of at least about 10%, at least about 15%, at least about 20%, at leas about 25%, at least about 30%, at least about 35%, at least about 40%, at least about 45%, at least about 50%, at least about 55%, at least about 60%, at least about 65%, at least about 70%, at least about 75%, at least about 80%, at least about 85% at least about 85% or even at least about 90%. According to still another embodiment, the composite film 400 may have a VLT of not greater than about 99%. It will be appreciated that the composite film 400 may have a VLT within a range between any of minimum and maximum values noted above. It will be further appreciated that the composite film 400 have a VLT of any value between any of the minimum and maximum values noted above.

According to still another embodiment, the composite film 400 may have a particular TSER. For example, the composite film 400 may have a TSER of at least about 60%, such as, at least about 62%, at least about 65%, at least about 67%, at least about 70%, at least about 72% or even at least about 75%. According to yet other embodiments, the composite film 400 may have a TSER of not greater than about 95%, such as, not greater than about 93%, not greater than about 90% or even not greater than about 88%. It will be appreciated that the composite film 400 may have a TSER within a range between any of minimum and maximum values noted above. It will be further appreciated that the composite film 400 may have a TSER of any value between any of the minimum and maximum values noted above.

According to yet other embodiments, the composite film 400 may have a particular Solar Control Ratio VLT/(100%-TSER). For example, the composite film 400 may have a Solar Control Ratio of at least about 0.45, such as, at least about 0.5, at least about 0.6, at least about 0.7, at least about 0.8, at least about 0.9, at least about 1.0, at least about 1.1, at least about 1.2, at least about 1.3, at least about 1.4 or even at least about 1.5. According to still other embodiments, the composite film 400 may have a Solar Control Ratio of not greater than about 2.0, such as, not greater than about 1.9, not greater than about 1.8, not greater than about 1.7 or even not greater than about 1.6. It will be appreciated that the composite film 400 may have a Solar Control Ratio within a range between any of minimum and maximum values noted above. It will be further appreciated that the composite film 400 may have a Solar Control Ratio of any value between any of the minimum and maximum values noted above.

According to still another embodiment, the composite film 400 may have a particular TTS. For example, the composite film 400 may have a TTS of not greater than about 50%, such as, not greater than about 45%, not greater than about 40%, not greater than about 35%, not greater than about 30%, not greater than about 29%, not greater than about 28%, not greater than about 27% or even not greater than about 26%. According to yet other embodiments, the composite film 400 may have a TTS of at least about 5%, such as, at least about 10% or even at least about 15%. It will be appreciated that the composite film 400 may have a TTS within a range between any of minimum and maximum values noted above. It will be further appreciated that the composite film 400 may have a TTS of any value between any of the minimum and maximum values noted above.

Figure 5A:
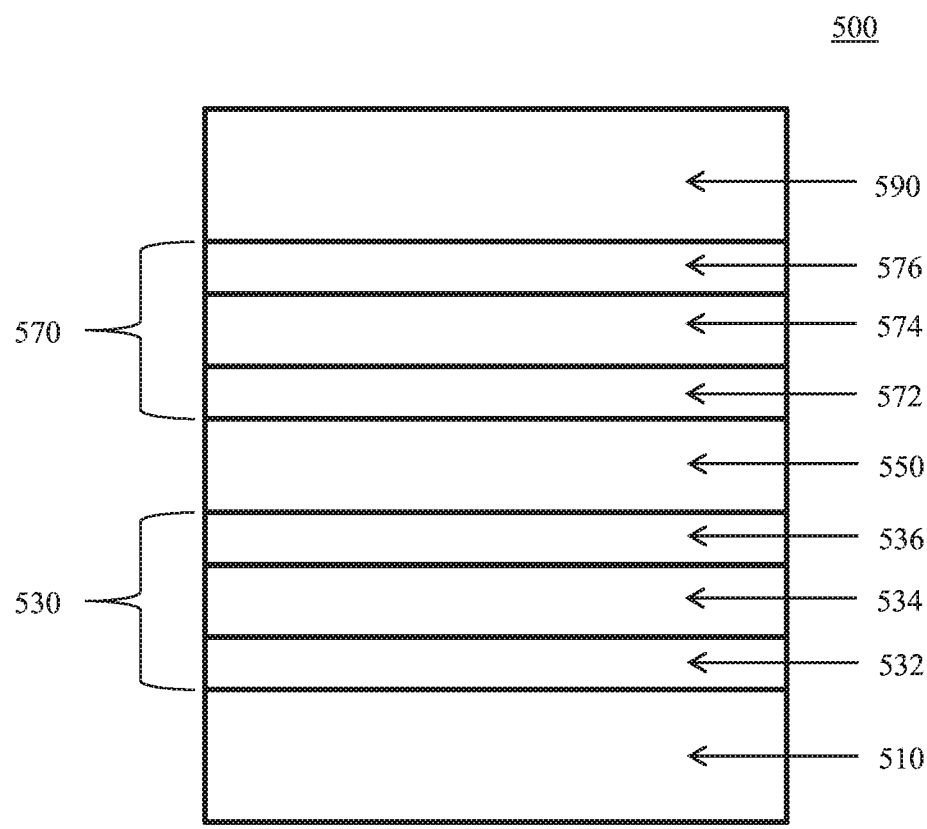
FIG. 5a includes an illustration of another example composite film according to certain embodiments described herein.

FIG. 5a includes an illustration of a cross-sectional view of a portion of another example composite film 500. As shown in FIG. 5a, the composite film 500 may include a first transparent substrate 510, a first infra-red reflection stack 530, a second infra-red reflection stack 570, a first dielectric layer 550 located between that first infra-red reflection stack 530 and the second infra-red reflection stack 570 and a second transparent substrate 590 located within the film so that the first infra-red reflection stack 530, the second infra-red reflection stack 570 and the first dielectric layer 550 are all located between the first transparent substrate 510 and the second transparent substrate 590. The first infra-red reflection stack 530 may include a first titanium blocker layer 532, a second titanium blocker layer 536 and a first functional layer 534. The first titanium blocker layer 532 may have a thickness of at least about 0.2 nm and not greater than about 5 nm. The second titanium blocker layer 536 may have a thickness of at least about 0.2 nm and not greater than about 5 nm. The first functional layer 534 may include silver. The second infra-red reflection stack 570 may include a third titanium blocker layer 572, a fourth titanium blocker layer 576 and a second functional layer 574. The third titanium blocker layer 572 may have a thickness of at least about 0.2 nm and not greater than about 5 nm. The second titanium blocker layer 576 may have a thickness of at least about 0.2 nm and not greater than about 5 nm. The second functional layer 574 may include silver.

It will be appreciated that the composite film 500 and all layer described in reference to the composite film 500 may have any of the characteristics described herein with reference to corresponding layers in FIG. 4.

According to particular embodiments, the second transparent substrate 590 may include a polymer material. According to another particular embodiment, the second transparent substrate 590 may consist of a polymer material. According to still other embodiments, the second transparent substrate 590 may be a polymer substrate layer. According to particular embodiments, the polymer substrate layer may include any desirable polymer material.

According to still other embodiments, the second transparent substrate 590 may include a polyethylene terephthalate (PET) material. According to another particular embodiment, the second transparent substrate 590 may consist of a PET material. According to still other embodiments, the second transparent substrate 590 may be a PET substrate layer. According to particular embodiments, the PET substrate layer may include any desirable polymer material.

According to yet another embodiment, the second transparent substrate 590 may include a glass material. According to yet another embodiment, the second transparent substrate 590 may consist of a glass material. According to still another embodiment, the second transparent substrate 590 may be a glass substrate layer. According to still other embodiments, the glass material may include any desirable glass material. According to still other embodiments, the glass substrate may have a VLT of at least about 85%, such as, at least about 86%, at least about 87% or even at least about 88%.

According to still other embodiments, when second transparent substrate 590 is a polymer substrate layer, it may have a particular thickness. For example, the second transparent substrate 590 may have a thickness of at least about 10 microns, such as, at least about 15 microns, at least about 20 microns, at least about 25 microns, at least about 30 microns, at least about 35 microns, at least about 40 microns, at least about 45 microns, at least about 50 microns, at least about 75 microns, at least about 100 micron or even at least about 125 microns. According to still another embodiment, the second transparent substrate 590 may have a thickness of not greater than about 250 microns, such as, not greater than about 245 microns, not greater than about 240 microns, not greater than about 235 microns, not greater than about 230 microns, not greater than about 225 microns, not greater than about 220 microns, not greater than about 215 microns, not greater than about 210 microns, not greater than about 205 microns, not greater than about 200 microns, not greater than about 175 microns or even not greater than about 150 microns. It will be appreciated that second transparent substrate 590 may have a thickness within a range between any of minimum and maximum values noted above. It will be further appreciated that second transparent substrate 590 may have a thickness of any value between any of the minimum and maximum values noted above.

Figure 5B:
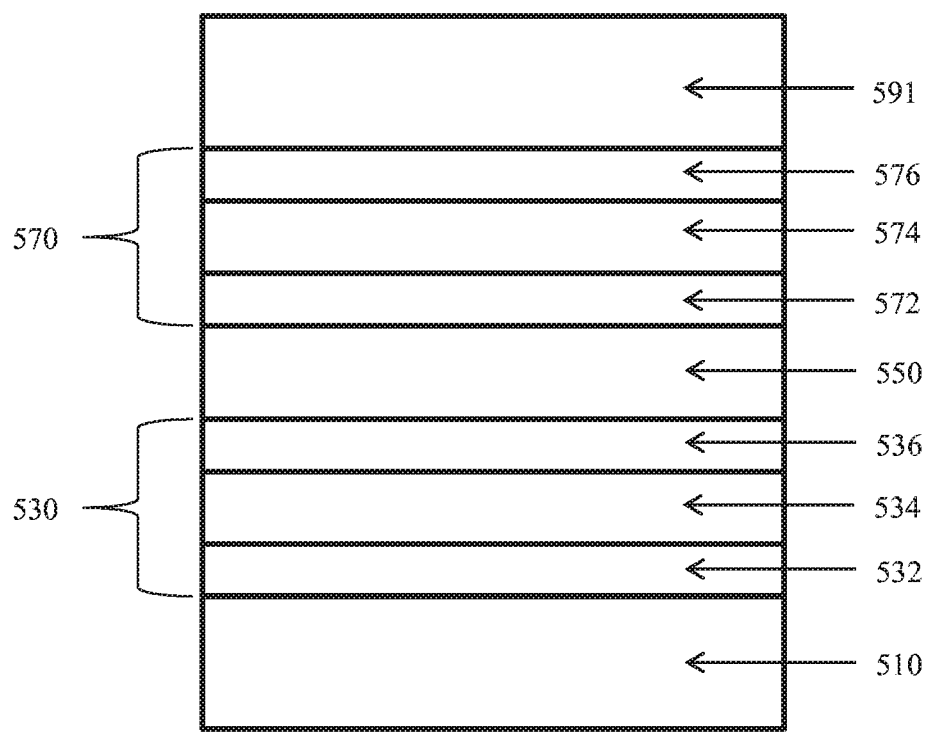
FIG. 5b includes an illustration of another example composite film according to certain embodiments described herein.

FIG. 5b includes an illustration of a cross-sectional view of a portion of another example composite film 501. As shown in FIG. 5b, the composite film 501 may include a first transparent substrate 510, a first infra-red reflection stack 530, a second infra-red reflection stack 570, a first dielectric layer 550 located between that first infra-red reflection stack 530 and the second infra-red reflection stack 570 and a first polyvinyl butyral (PVB) substrate 591 located within the film so that the first infra-red reflection stack 530, the second infra-red reflection stack 570 and the first dielectric layer 550 are all located between the first transparent substrate 510 and the first PVB substrate 591. The first infra-red reflection stack 530 may include a first titanium blocker layer 532, the second titanium blocker layer 536 and a first functional layer 534. The first titanium blocker layer 532 may have a thickness of at least about 0.2 nm and not greater than about 5 nm. The second titanium blocker layer 536 may have a thickness of at least about 0.2 nm and not greater than about 5 nm. The first functional layer 534 may include silver. The second infra-red reflection stack 570 may include a third titanium blocker layer 572, a fourth titanium blocker layer 576 and a second functional layer 574. The second functional layer 574 may include silver.

It will be appreciated that the composite film 501 and all layers described in reference to the composite film 501 may have any of the characteristics described herein with reference to corresponding layers in FIGS. 4 and 5a.

According to particular embodiments, the first PVB substrate 591 may comprise a clear PVB material. For purposes of embodiments described herein, a clear PVB material may be defined as a PVB material that does not dye or material darkening agent. According to still other embodiments the first PVB substrate 591 may consist of a clear PVB material. According to yet other embodiments, the first PVB substrate 591 may be a first clear PVB substrate 591. According to still another embodiment, the first PVB substrate 591 may have a VLT of at least about 85%, such as, at least about 86%, at least about 87% or even at least about 88%.

Figure 5C:
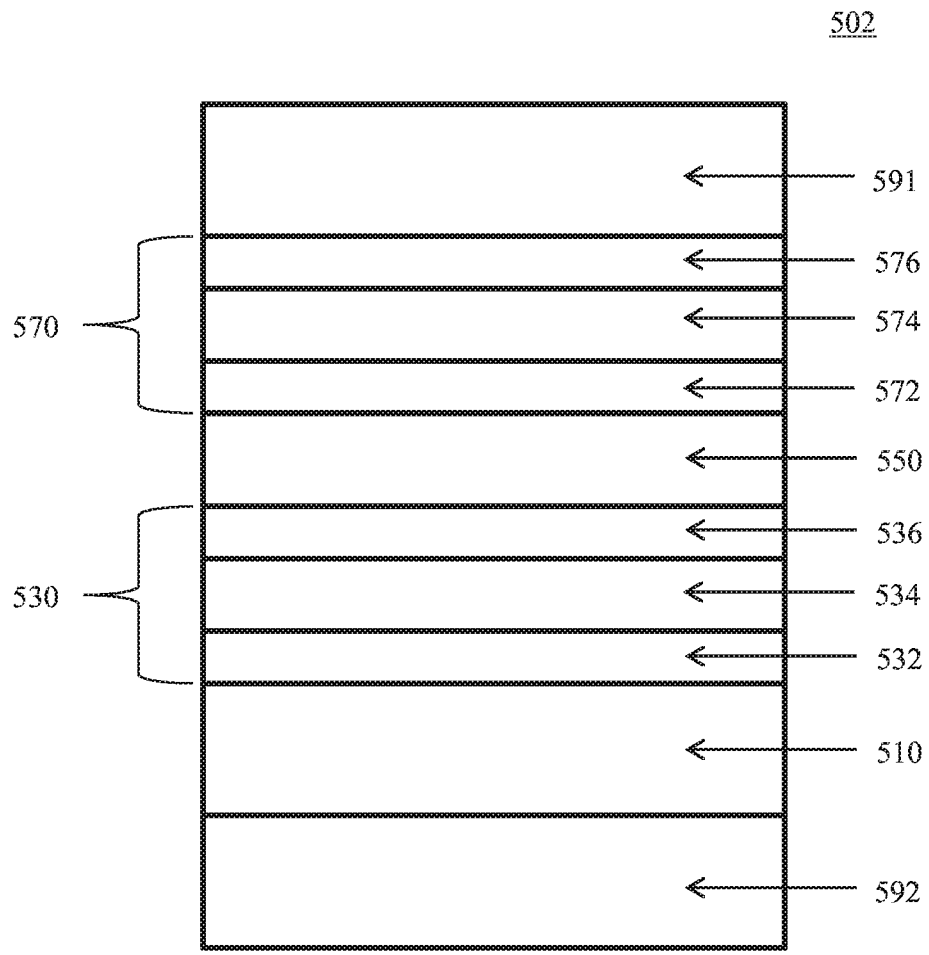
FIG. 5c includes an illustration of another example composite film according to certain embodiments described herein.

FIG. 5c includes an illustration of a cross-sectional view of a portion of another example composite film 502. As shown in FIG. 5c, the composite film 502 may include a first transparent substrate 510, a first infra-red reflection stack 530, a second infra-red reflection stack 570, a first dielectric layer 550 located between that first infra-red reflection stack 530 and the second infra-red reflection stack 570, a first polyvinyl butyral (PVB) substrate 591 and a second PVB substrate 592 located within the film so that the first infra-red reflection stack 530, the second infra-red reflection stack 570, the first dielectric layer 550 and the first transparent substrate 510 are all located between the first PVB substrate 591 and the second PVB substrate 592. The first infra-red reflection stack 530 may include a first titanium blocker layer 532, the second titanium blocker layer 536 and a first functional layer 534. The first titanium blocker layer 532 may have a thickness of at least about 0.2 nm and not greater than about 5 nm. The second titanium blocker layer 536 may have a thickness of at least about 0.2 nm and not greater than about 5 nm. The first functional layer 534 may include silver. The second infra-red reflection stack 570 may include a third titanium blocker layer 572, a fourth titanium blocker layer 576 and a second functional layer 574. The second functional layer 574 may include silver.

It will be appreciated that the composite film 502 and all layers described in reference to the composite film 502 may have any of the characteristics described herein with reference to corresponding layers in FIGS. 4, 5a and 5b.

According to particular embodiments, the second PVB substrate 592 may comprise a clear PVB material. For purposes of embodiments described herein, a clear PVB material may be defined as a PVB material that does not dye or material darkening agent. According to still other embodiments the second PVB substrate 592 may consist of a clear PVB material. According to yet other embodiments, the second PVB substrate 592 may be a second clear PVB substrate 592. According to still another embodiment, the second PVB substrate 592 may have a VLT of at least about 85%, such as, at least about 86%, at least about 87% or even at least about 88%.

Figure 5D:
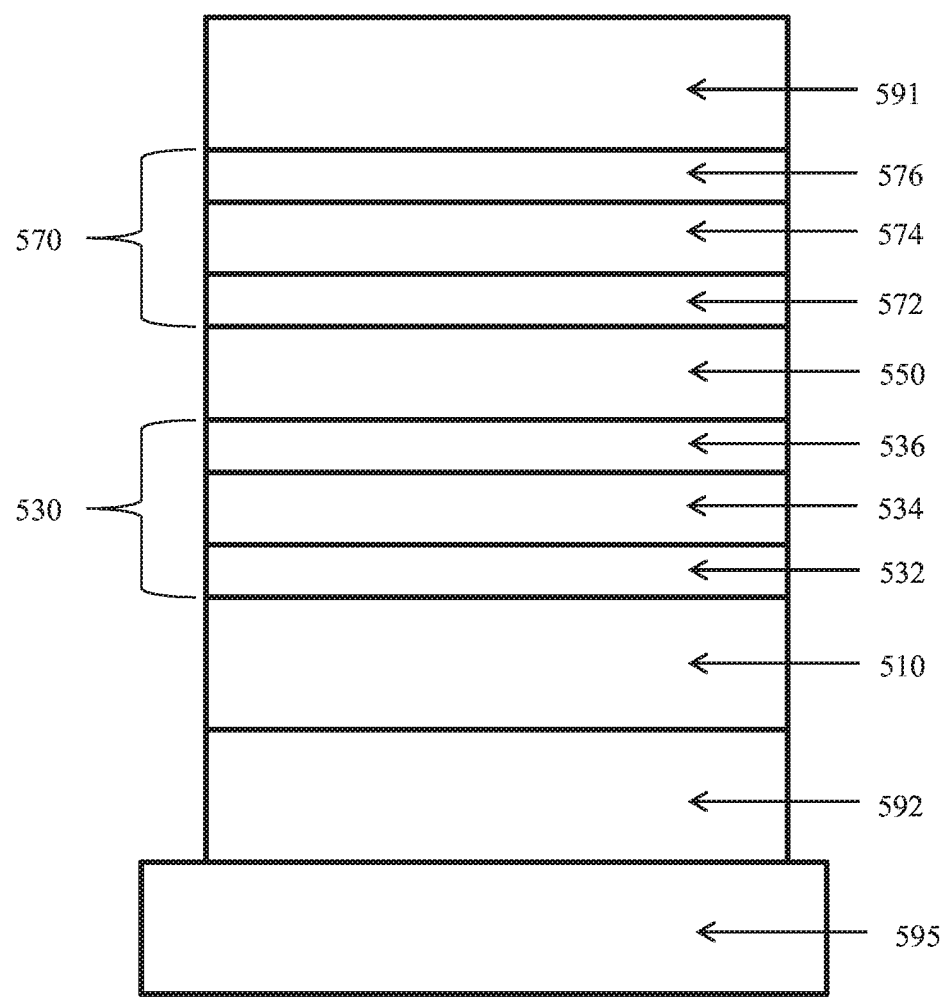
FIG. 5d includes an illustration of another example composite film according to certain embodiments described herein.

FIG. 5d includes an illustration of a cross-sectional view of a portion of another example composite film 503. As shown in FIG. 5d, the composite film 502 may include a first transparent substrate 510, a first infra-red reflection stack 530, a second infra-red reflection stack 570, a first dielectric layer 550 located between that first infra-red reflection stack 530 and the second infra-red reflection stack 570, a first polyvinyl butyral (PVB) substrate 591, a second PVB substrate 592 and a first glass substrate 595 located within the film so that the first infra-red reflection stack 530, the second infra-red reflection stack 570, the first dielectric layer 550, the first transparent substrate 510 and the second PVB substrate 592 are all located between the first PVB substrate 591 and the first glass substrate 595. The first infra-red reflection stack 530 may include a first titanium blocker layer 532, the second titanium blocker layer 536 and a first functional layer 534. The first titanium blocker layer 532 may have a thickness of at least about 0.2 nm and not greater than about 5 nm. The second titanium blocker layer 536 may have a thickness of at least about 0.2 nm and not greater than about 5 nm. The first functional layer 534 may include silver. The second infra-red reflection stack 570 may include a third titanium blocker layer 572, a fourth titanium blocker layer 576 and a second functional layer 574. The second functional layer 574 may include silver.

It will be appreciated that the composite film 503 and all layers described in reference to the composite film 503 may have any of the characteristics described herein with reference to corresponding layers in FIGS. 4, 5a, 5b and 5c.

According to particular embodiments, the first glass substrate 595 may comprise a dark glass material. According to still other embodiments the first glass substrate 595 may consist of a dark glass material. According to yet other embodiments, the first glass substrate 595 may be a first dark glass substrate 595.

According to still another embodiment, the first glass substrate 595 is a first dark glass substrate, the first glass substrate 595 may have a VLT of at least about 10%, such as, at least about 15%, at least about 20% or even at least about 30%. According to still another embodiment, first glass substrate 595 may have a VLT of not greater than about 50%, such as, not greater than about 45%, not greater than about 40% or even not greater than about 35%. It will be appreciated that the first glass substrate 595 may have a VLT within a range between any of minimum and maximum values noted above. It will be further appreciated that the first glass substrate 595 may have a VLT of any value between any of the minimum and maximum values noted above.

Figure 6:
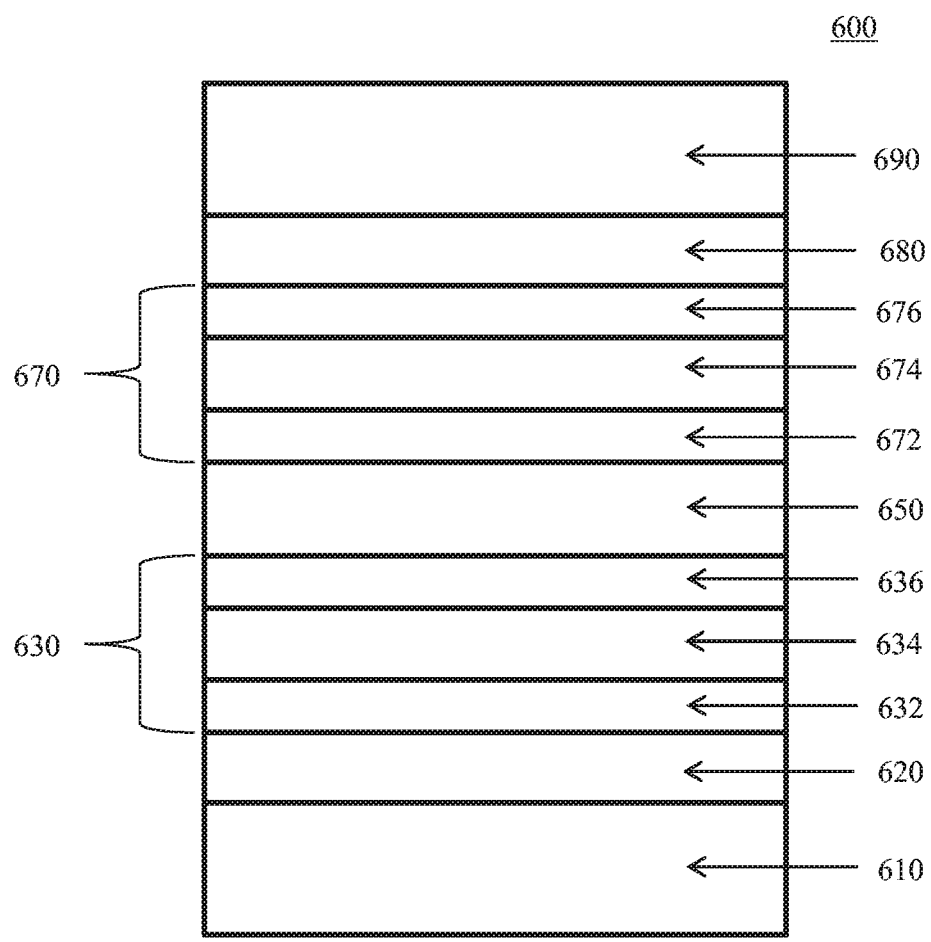
FIG. 6 includes an illustration of another example composite film according to certain embodiments described herein.

FIG. 6 includes an illustration of a cross-sectional view of a portion of another example composite film 600. As shown in FIG. 6, the composite film 600 may include a first transparent substrate 610, a first infra-red reflection stack 630, a second infra-red reflection stack 670, a first dielectric layer 650 located between that first infra-red reflection stack 630 and the second infra-red reflection stack 670, a second dielectric layer 60 located so that the first infra-red reflection stack 630 is located between the first dielectric layer 650 and the second dielectric layer 620, a third dielectric layer 680 located so that the second infra-red stack 670 is located between the first dielectric layer 650 and the third dielectric layer 680 and a second transparent substrate 690 located within the composite film 600 so that the first infra-red reflection stack 630, the second infra-red reflection stack 670, the first dielectric layer 650, the second dielectric layer 620 and the third dielectric layer 680 are all located between the first transparent substrate 610 and the second transparent substrate 690. The first infra-red reflection stack 630 may include a first titanium blocker layer 632, a second titanium blocker layer 636 and a first functional layer 634. The first titanium blocker layer 632 may have a thickness of at least about 0.2 nm and not greater than about 5 nm. The second titanium blocker layer 636 may have a thickness of at least about 0.2 nm and not greater than about 5 nm. The first functional layer 634 may include silver. The second infra-red reflection stack 670 may include a third titanium blocker layer 672, a fourth titanium blocker layer 676 and a second functional layer 674. The third titanium blocker layer 672 may have a thickness of at least about 0.2 nm and not greater than about 5 nm. The second titanium blocker layer 676 may have a thickness of at least about 0.2 nm and not greater than about 5 nm. The second functional layer 674 may include silver.

It will be appreciated that the composite film 600 and all layer described in reference to the composite film 600 may have any of the characteristics described herein with reference to corresponding layers in FIG. 4 or 5.

According to certain embodiments, the second dielectric layer 620 may include a dielectric material. According to still other embodiments, the second dielectric layer 620 may consist essentially of a dielectric material. The dielectric material of the second dielectric layer 620 may be any known transparent dielectric material, such as, any one of ITO, $SnZnO_x$, $SiO_x$, $Si_3N_4$, $Nb_2O_x$, $TiO_x$, $In_2O_x$, $ZnO_x$ or AZO. According to certain embodiments, the second dielectric layer 620 may include any one of ITO, $SnZnO_x$, $SiO_x$, $Si_3N_4$, $Nb_2O_x$, $TiO_x$, $In_2O_x$, ZnO, or AZO. According to still other embodiments, the second dielectric layer 620 may consist essentially of any one of ITO, $SnZnO_x$, $SiO_x$, $Si_3N_4$, $Nb_2O_x$, $TiO_x$, $In_2O_x$, $ZnO_x$ or AZO.

According to yet another embodiment, the second dielectric layer 620 may have a particular thickness. For example, the second dielectric layer 620 may have a thickness of not greater than about 200 nanometers, such as, not greater than about 190 nanometers, not greater than about 180 nanometers, not greater than about 170 nanometers, not greater than about 160 nanometers, not greater than about 150 nanometers, not greater than about 140 nanometers, not greater than about 130 nanometers, not greater than about 120 nanometers, not greater than about 110 nanometers, not greater than about 100 nanometers, not greater than about 95 nanometers, not greater than about 90 nanometers, not greater than about 85 nanometers, not greater than about 80 nanometers, not greater than about 75 nanometers, not greater than about 70 nanometers, not greater than about 65 nanometers, not greater than about 60 nanometers, not greater than about 55 nanometers, not greater than about 50 nanometers, not greater than about 45 nanometers, not greater than about 40 nanometers, not greater than about 35 nanometers, not greater than about 30 nanometers, not greater than about 30 nanometers, not greater than about 25 nanometers, not greater than about 20 nanometers or even not greater than about 15. According to still another embodiment, the second dielectric layer 620 may have a thickness of at least about 3 nanometers, such as, at least about 5 nanometers, at least about 8 nanometers, at least about 10 nanometers, at least about 20 nanometers, at least about 25 nanometers or even at least about 30 nanometers. It will be appreciated that the second dielectric layer 620 may have a thickness within a range between any of minimum and maximum values noted above. It will be further appreciated that the second dielectric layer 620 may have a thickness of any value between any of the minimum and maximum values noted above.

It will be appreciated that the second dielectric layer 620 may include multiple dielectric layers. It will be further appreciated that any dielectric layer making up the second dielectric layer 620 may have any of the characteristics described herein in reference to the second dielectric layer 620.

According to certain embodiments, the third dielectric layer 680 may include a dielectric material. According to still other embodiments, the third dielectric layer 680 may consist essentially of a dielectric material. The dielectric material of the third dielectric layer 380 may be any known transparent dielectric material, such as, any one of ITO, $SnZnO_x$, $SiO_x$, $Si_3N_4$, $Nb_2O_x$, $TiO_x$, $In_2O_x$, ZnO, or AZO. According to certain embodiments, the third dielectric layer 680 may include any one of ITO, $SnZnO_x$, $SiO_x$, $Si_3N_4$, $Nb_2O_x$, $TiO_x$, $In_2O_x$, $ZnO_x$ or AZO. According to still other embodiments, the third dielectric layer 680 may consist essentially of any one of ITO, $SnZnO_x$, $SiO_x$, $Si_3N_4$, $Nb_2O_x$, $TiO_x$, $In_2O_x$, $ZnO_x$ or AZO.

According to yet another embodiment, the third dielectric layer 680 may have a particular thickness. For example, the third dielectric layer 680 may have a thickness of not greater than about 200 nanometers, such as, not greater than about 190 nanometers, not greater than about 180 nanometers, not greater than about 170 nanometers, not greater than about 160 nanometers, not greater than about 150 nanometers, not greater than about 140 nanometers, not greater than about 130 nanometers, not greater than about 120 nanometers, not greater than about 110 nanometers, not greater than about 100 nanometers, not greater than about 95 nanometers, not greater than about 90 nanometers, not greater than about 85 nanometers, not greater than about 80 nanometers, not greater than about 75 nanometers, not greater than about 70 nanometers, not greater than about 65 nanometers, not greater than about 60 nanometers, not greater than about 55 nanometers, not greater than about 50 nanometers, not greater than about 45 nanometers, not greater than about 40 nanometers, not greater than about 35 nanometers, not greater than about 30 nanometers, not greater than about 30 nanometers, not greater than about 25 nanometers, not greater than about 20 nanometers or even not greater than about 15. According to still another embodiment, the third dielectric layer 680 may have a thickness of at least about 3 nanometers, such as, at least about 5 nanometers, at least about 8 nanometers, at least about 10 nanometers, at least about 20 nanometers, at least about 25 nanometers or even at least about 30 nanometers. It will be appreciated that the third dielectric layer 680 may have a thickness within a range between any of minimum and maximum values noted above. It will be further appreciated that the third dielectric layer 680 may have a thickness of any value between any of the minimum and maximum values noted above.

It will be appreciated that the third dielectric layer 680 may include multiple dielectric layers. It will be further appreciated that any dielectric layer making up the third dielectric layer 680 may have any of the characteristics described herein in reference to the third dielectric layer 680.

Many different aspects and embodiments are possible. Some of those aspects and embodiments are described herein. After reading this specification, skilled artisans will appreciate that those aspects and embodiments are only illustrative and do not limit the scope of the present invention. Embodiments may be in accordance with any one or more of the embodiments as listed below.

Embodiment 1. A composite film comprising: a first transparent substrate stack; a dielectric layer; and at least two infra-red reflection stacks, wherein the dielectric layer is disposed between the at least two infra-red reflection stacks; and wherein each infra-red reflection stack comprises: two titanium metal blocker layers; and a functional layer comprising silver between the two titanium metal layers.

Embodiment 2. A composite film comprising: a first transparent substrate stack; a first dielectric layer adjacent to the first transparent substrate stack; a first titanium metal blocker layer adjacent to the first dielectric layer; a first functional layer comprising silver adjacent to the first titanium blocker layer; a second titanium metal blocker layer adjacent to the first function layer; a second dielectric layer adjacent to the second titanium blocker layer; a third titanium metal blocker layer adjacent to the second dielectric layer; a second functional layer comprising silver adjacent to the third titanium blocker layer; a fourth titanium metal blocker layer adjacent to the second function layer; a third dielectric layer adjacent to the fourth titanium blocker layer; and a second transparent substrate stack overlying to the third dielectric layer.

Embodiment 3. A method of forming composite film, wherein the method comprises: providing a first transparent substrate stack; forming a first dielectric layer adjacent to the first transparent substrate stack; forming a first titanium metal blocker layer adjacent to the first dielectric layer; forming a first functional layer comprising silver adjacent to the first titanium blocker layer; forming a second titanium metal blocker layer adjacent to the first function layer; forming a second dielectric layer adjacent to the second titanium blocker layer; forming a third titanium metal blocker layer adjacent to the second dielectric layer; forming a second functional layer comprising silver adjacent to the third titanium blocker layer; forming a titanium metal blocker layer adjacent to the second function layer; forming a third dielectric layer adjacent to the fourth titanium blocker layer; and providing a second transparent substrate stack overlying the third dielectric layer.

Embodiment 4. The composite film or method of any of embodiments 1, 2 and 3, wherein the first transparent substrate stack comprises a first polymer substrate layer, wherein the first transparent substrate stack comprises a first glass substrate layer, wherein the first transparent substrate stack comprises a first polymer substrate layer and a first glass substrate layer; wherein the first substrate stack consists of a first polymer substrate layer and a first glass substrate layer.

Embodiment 5. The composite film or method of embodiment 4, wherein the first polymer substrate layer comprises a PET, wherein the first transparent substrate consists of PET, wherein the first polymer substrate layer comprises a PVB, wherein the first transparent substrate consists of PVB.

Embodiment 6. The composite film or method of embodiment 4, wherein the first glass substrate layer comprises a dark glass, wherein the dark glass has a VLT of at least about 10%.

Embodiment 7. The composite film or method of any of embodiments 1, 2 and 3, wherein the second transparent substrate stack comprises a second polymer substrate layer, wherein the second transparent substrate stack comprises a second glass substrate layer, wherein the second transparent substrate stack comprises a second polymer substrate layer and a second glass substrate layer; wherein the second substrate stack consists of a second polymer substrate layer and a second glass substrate layer.

Embodiment 8. The composite film or method of embodiment 4, wherein the second polymer substrate layer comprises a PET, wherein the second transparent substrate consists of PET, wherein the second polymer substrate layer comprises a PVB, wherein the second transparent substrate consists of PVB.

Embodiment 9. The composite film or method of embodiment 4, wherein the second glass substrate layer comprises a clear glass, wherein the clear glass has a VLT of at least about 85%.

Embodiment 10. The composite film or method of any of embodiments 1, 2 and 3, wherein the composite film comprises a VLT of at least about 5%.

Embodiment 11. The composite film or method of any of embodiments 1, 2 and 3, wherein the composite film comprises a VLT of not greater than about 95%.

Embodiment 12. The composite film or method of any of embodiments 1, 2 and 3, wherein the composite film comprises a TSER of at least about 65%.

Embodiment 13. The composite film or method of any of embodiments 1, 2 and 3, wherein the composite film comprises a TSER of not greater than about 95%.

Embodiment 14. The composite film or method of any of embodiments 1, 2 and 3, wherein the functional layers consist essentially of silver.

Embodiment 15. The composite film or method of any of embodiments 1, 2 and 3, wherein the blocker layers consist essentially of titanium metal.

Embodiment 16. The composite film or method of any of embodiments 1, 2 and 3, wherein the first functional layer has a thickness of at least about 5 nanometers, at least about 6 nanometers, at least about 7 nanometers, at least about 8 nanometers, at least about 9 nanometers, at least about 10 nanometers, at least about 12 nanometers, at least about 14 nanometers, at least about 16 nanometers, at least about 18 nanometers and at least about 20 nanometers.

Embodiment 17. The composite film or method of any of embodiments 1, 2 and 3, wherein the first functional layer has a thickness of not greater than about 25 nanometers, not greater than about 24 nanometers, not greater than about 23 nanometers, not greater than about 22 nanometers, not greater than about 21 nanometers, not greater than about 20 nanometers, not greater than about 19 nanometers, not greater than about 18 nanometers, not greater than about 17 nanometers, not greater than about 16 nanometers and not greater than about 15 nanometers.

Embodiment 18. The composite film or method of any of embodiments 1, 2 and 3, wherein the second functional layer has a thickness of at least about 5 nanometers, at least about 6 nanometers, at least about 7 nanometers, at least about 8 nanometers, at least about 9 nanometers, at least about 10 nanometers, at least about 12 nanometers, at least about 14 nanometers, at least about 16 nanometers, at least about 18 nanometers and at least about 20 nanometers.

Embodiment 19. The composite film or method of any of embodiments 1, 2 and 3, wherein the second functional layer has a thickness of not greater than about 25 nanometers, not greater than about 24 nanometers, not greater than about 23 nanometers, not greater than about 22 nanometers, not greater than about 21 nanometers, not greater than about 20 nanometers, not greater than about 19 nanometers, not greater than about 18 nanometers, not greater than about 17 nanometers, not greater than about 16 nanometers and not greater than about 15 nanometers.

Embodiment 20. The composite film or method of any of embodiments 1, 2 and 3, wherein the each of the blocker layers has a thickness of not greater than about 5 nanometers, not greater than about 4.5 nanometers, not greater than about 4 nanometers, not greater than about 3.5 nanometers, not greater than about 3 nanometers, not greater than about 2.8 nanometers, not greater than about 2.6 nanometers, not greater than about 2.4 nanometers, not greater than about 2.2 nanometers, not greater than about 2.0 nanometers, not greater than about 1.8 nanometers, not greater than about 1.6 nanometers, not greater than about 1.4 nanometers, not greater than about 1.2 nanometers, not greater than about 1.0 nanometers, not greater than about 0.8 nanometers, not greater than about 0.6 nanometers, not greater than about 0.5 nanometers, not greater than about 0.4 nanometers, not greater than about 0.3 nanometers and not greater than about 0.2 nanometers.

Embodiment 21. The composite film or method of any of embodiments 1, 2 and 3, wherein the each of the blocker layers has a thickness of at least about 0.1 nanometers, at least about 0.2 nanometers, at least about 0.3 nanometers, at least about 0.4 nanometers. Embodiment 22. The composite film or method of any of embodiments 1, 2 and 3, wherein the dielectric layers comprise ITO, $SnZnO_x$, $SiO_x$, $Si_3N_4$, $Nb_2O_x$, $TiO_x$, $In_2O_x$, $ZnO_x$ or AZO.

Embodiment 23. The composite film or method of any of embodiments 1, 2 and 3, wherein the dielectric layers consist essentially of ITO, $SnZnO_x$, $SiO_x$, $Si_3N_4$, $Nb_2O_x$, $TiO_x$, $In_2O_x$, ZnO, or AZO.

Embodiment 24. The composite film or method of any of embodiments 1, 2 and 3, wherein the composite film comprises a Solar Control Ratio VLT/(100%-TSER) of at least about 0.45.

Embodiment 25. The composite film or method of any of embodiments 1, 2 and 3, wherein the composite film further comprises a thickness ratio $TH_{BL1}/TH_{FL}$ of not greater than about 0.5, where $TH_{BL1}$ is the average thickness of the blocker layers in the composite film and $TH_{FL}$ is the average thickness of the functional layers in the composite film, not greater than about 0.45, not greater than about 0.4, not greater than about 0.35, not greater than about 0.3, not greater than about 0.25, not greater than about 0.2, not greater than about 0.15, not greater than about 0.1 and not greater than about 0.05.

Embodiment 26. The composite film or method of any of embodiments 1, 2 and 3, wherein the composite film further comprises a thickness ratio $TH_{BL1}/TH_{FL}$ of at least about 0.01, where $TH_{BL1}$ is the average thickness of the blocker layers in the composite film and $TH_{FL}$ is the average thickness of the functional layers in the composite film, at least about 0.02, at least about 0.03, at least about 0.04, at least about 0.05, at least about 0.06, at least about 0.07, at least about 0.08, at least about 0.09 and at least about 0.1.

Embodiment 27. A composite film comprising: a first transparent substrate stack; a dielectric layer; and at least two infra-red reflection stacks, wherein the dielectric layer is disposed between the at least two infra-red reflection stacks; and wherein each infra-red reflection stack comprises: two titanium metal blocker layers; and a functional layer comprising silver between the two titanium metal layers, and wherein the blocker layers each have a thickness of at least about 0.2 nm and not greater than about 5 nm.

Embodiment 28. A composite film comprising: a first transparent substrate stack; a first dielectric layer adjacent to the first transparent substrate stack; a first titanium metal blocker layer adjacent to the first dielectric layer; a first functional layer comprising silver adjacent to the first titanium blocker layer; a second titanium metal blocker layer adjacent to the first function layer; a second dielectric layer adjacent to the second titanium blocker layer; a third titanium metal blocker layer adjacent to the second dielectric layer; a second functional layer comprising silver adjacent to the third titanium blocker layer; a fourth titanium metal blocker layer adjacent to the second function layer; a third dielectric layer adjacent to the fourth titanium blocker layer; and a second transparent substrate stack overlying to the third dielectric layer, wherein the blocker layers each have a thickness of at least about 0.2 nm and not greater than about 5 nm.

Embodiment 29. A method of forming composite film, wherein the method comprises: providing a first transparent substrate stack; forming a first dielectric layer adjacent to the first transparent substrate stack; forming a first titanium metal blocker layer adjacent to the first dielectric layer; forming a first functional layer comprising silver adjacent to the first titanium blocker layer; forming a second titanium metal blocker layer adjacent to the first function layer; forming a second dielectric layer adjacent to the second titanium blocker layer; forming a third titanium metal blocker layer adjacent to the second dielectric layer; forming a second functional layer comprising silver adjacent to the third titanium blocker layer; forming a titanium metal blocker layer adjacent to the second function layer; forming a third dielectric layer adjacent to the fourth titanium blocker layer; and providing a second transparent substrate stack overlying the third dielectric layer, wherein the blocker layers each have a thickness of at least about 0.2 nm and not greater than about 5 nm.

Embodiment 30. The composite film or method of any of embodiments 27, 28 and 29, wherein the first transparent substrate stack comprises a first polymer substrate layer, wherein the first transparent substrate stack comprises a first glass substrate layer, wherein the first transparent substrate stack comprises a first polymer substrate layer and a first glass substrate layer; wherein the first substrate stack consists of a first polymer substrate layer and a first glass substrate layer.

Embodiment 31. The composite film or method of embodiment 30, wherein the first polymer substrate layer comprises a PET, wherein the first transparent substrate consists of PET, wherein the first polymer substrate layer comprises a PVB, wherein the first transparent substrate consists of PVB.

Embodiment 32. The composite film or method of embodiment 30, wherein the first glass substrate layer comprises a dark glass, wherein the dark glass has a VLT at least about 10% (at least about 30%).

Embodiment 33. The composite film or method of any of embodiments 1, 2 and 3, wherein the second transparent substrate stack comprises a second polymer substrate layer, wherein the second transparent substrate stack comprises a second glass substrate layer, wherein the second transparent substrate stack comprises a second polymer substrate layer and a second glass substrate layer; wherein the second substrate stack consists of a second polymer substrate layer and a second glass substrate layer.

Embodiment 34. The composite film or method of embodiment 30, wherein the second polymer substrate layer comprises a PET, wherein the second transparent substrate consists of PET, wherein the second polymer substrate layer comprises a PVB, wherein the second transparent substrate consists of PVB.

Embodiment 35. The composite film or method of embodiment 30, wherein the second glass substrate layer comprises a clear glass, wherein the clear glass has a VLT at least about 85%.

Embodiment 36. The composite film or method of any of embodiments 27, 28 and 29, wherein the composite film comprises a VLT of at least about 5%.

Embodiment 37. The composite film or method of any of embodiments 27, 28 and 29, wherein the composite film comprises a VLT of not greater than about 95%.

Embodiment 38. The composite film or method of any of embodiments 27, 28 and 29, wherein the composite film comprises a TSER of at least about 65%.

Embodiment 39. The composite film or method of any of embodiments 27, 28 and 29, wherein the composite film comprises a TSER of not greater than about 95%.

Embodiment 40. The composite film or method of any of embodiments 27, 28 and 29, wherein the functional layers consist essentially of silver.

Embodiment 41. The composite film or method of any of embodiments 27, 28 and 29, wherein the blocker layers consist essentially of titanium metal.

Embodiment 42. The composite film or method of any of embodiments 27, 28 and 29, wherein the first functional layer has a thickness of at least about 5 nanometers, at least about 6 nanometers, at least about 7 nanometers, at least about 8 nanometers, at least about 9 nanometers, at least about 10 nanometers, at least about 12 nanometers, at least about 14 nanometers, at least about 16 nanometers, at least about 18 nanometers and at least about 20 nanometers.

Embodiment 43. The composite film or method of any of embodiments 27, 28 and 29, wherein the first functional layer has a thickness of not greater than about 25 nanometers, not greater than about 24 nanometers, not greater than about 23 nanometers, not greater than about 22 nanometers, not greater than about 21 nanometers, not greater than about 20 nanometers, not greater than about 19 nanometers, not greater than about 18 nanometers, not greater than about 17 nanometers, not greater than about 16 nanometers and not greater than about 15 nanometers.

Embodiment 44. The composite film or method of any of embodiments 27, 28 and 29, wherein the second functional layer has a thickness of at least about 5 nanometers, at least about 6 nanometers, at least about 7 nanometers, at least about 8 nanometers, at least about 9 nanometers, at least about 10 nanometers, at least about 12 nanometers, at least about 14 nanometers, at least about 16 nanometers, at least about 18 nanometers and at least about 20 nanometers.

Embodiment 45. The composite film or method of any of embodiments 27, 28 and 29, wherein the second functional layer has a thickness of not greater than about 25 nanometers, not greater than about 24 nanometers, not greater than about 23 nanometers, not greater than about 22 nanometers, not greater than about 21 nanometers, not greater than about 20 nanometers, not greater than about 19 nanometers, not greater than about 18 nanometers, not greater than about 17 nanometers, not greater than about 16 nanometers and not greater than about 15 nanometers.

Embodiment 46. The composite film or method of any of embodiments 27, 28 and 29, wherein the each of the blocker layers has a thickness of not greater than about 5 nanometers, not greater than about 4.5 nanometers, not greater than about 4 nanometers, not greater than about 3.5 nanometers, not greater than about 3 nanometers, not greater than about 2.8 nanometers, not greater than about 2.6 nanometers, not greater than about 2.4 nanometers, not greater than about 2.2 nanometers, not greater than about 2.0 nanometers, not greater than about 1.8 nanometers, not greater than about 1.6 nanometers, not greater than about 1.4 nanometers, not greater than about 1.2 nanometers, not greater than about 1.0 nanometers, not greater than about 0.8 nanometers, not greater than about 0.6 nanometers, not greater than about 0.5 nanometers, not greater than about 0.4 nanometers, not greater than about 0.3 nanometers and not greater than about 0.2 nanometers.

Embodiment 47. The composite film or method of any of embodiments 27, 28 and 29, wherein the each of the blocker layers has a thickness of at least about 0.1 nanometers, at least about 0.2 nanometers, at least about 0.3 nanometers, at least about 0.4 nanometers.

Embodiment 48. The composite film or method of any of embodiments 1, 2 and 3, wherein the dielectric layers comprise ITO, $SnZnO_x$, $SiO_x$, $Si_3N_4$, $Nb_2O_x$, $TiO_x$, $In_2O_x$, $ZnO_x$ or AZO.

Embodiment 49. The composite film or method of any of embodiments 1, 2 and 3, wherein the dielectric layers consist essentially of ITO, $SnZnO_x$, $SiO_x$, $Si_3N_4$, $Nb_2O_x$, $TiO_x$, $In_2O_x$, $ZnO_x$ or AZO.

Embodiment 50. The composite film or method of any of embodiments 27, 28 and 29, wherein the composite film comprises a Solar Control Ratio VLT/(100%-TSER) of at least about 0.5.

Embodiment 51. The composite film or method of any of embodiments 27, 28 and 29, wherein the composite film further comprises a thickness ratio $TH_{BL1}/TH_{FL}$ of not greater than about 0.5, where $TH_{BL1}$ is the average thickness of the blocker layers in the composite film and $TH_{FL}$ is the average thickness of the functional layers in the composite film, not greater than about 0.45, not greater than about 0.4, not greater than about 0.35, not greater than about 0.3, not greater than about 0.25, not greater than about 0.2, not greater than about 0.15, not greater than about 0.1 and not greater than about 0.05.

Embodiment 52. The composite film or method of any of embodiments 27, 28 and 29, wherein the composite film further comprises a thickness ratio $TH_{BL1}/TH_{FL}$ of at least about 0.01, where $TH_{BL1}$ is the average thickness of the blocker layers in the composite film and $TH_{FL}$ is the average thickness of the functional layers in the composite film, at least about 0.02, at least about 0.03, at least about 0.04, at least about 0.05, at least about 0.06, at least about 0.07, at least about 0.08, at least about 0.09 and at least about 0.1.

EXAMPLES

The concepts described herein will be further described in the following Examples, which do not limit the scope of the invention described in the claims.

Example 1

Two sample composite films S1 and S2 were configured and formed according to certain embodiments described herein. Sample composite films S1 and S2 both included a first dark glass substrate (i.e., bottom), a first clear PVB substrate, a second clear PVB substrate, first transparent PET substrate (i.e., bottom), a first infra-red reflection stack having a silver functional layer between two titanium blocker layers, a second infra-red reflection stack having a silver functional layer between two titanium blockers layers, and three $TiO_x$ dielectric layers. The configuration of layers in the sample composite film, including general layer composition, arrangement and thickness, are summarized below in Table 1. It will be appreciated that the order of the layers listed in Table 1 indicates the order of the layers in the composite window film with the bottom row in the table corresponding to the bottom layer in the composite window film.

TABLE 1

Sample Composite Window Film Configuration

|  | S1 | S2 |
|---|---|---|
| CLEAR GLASS (mm) | 0.7-2.1 | 0.7-2.1 |
| CLEAR PVB SUB. (μm) | 380 | 380 |
| TiOx (nm) | 27 | 27 |
| Ti (nm) | 0.5 | 0.5 |
| Ag (nm) | 10 | 10 |
| Ti (nm) | 0.5 | 0.5 |
| TiOx (nm) | 60 | 60 |
| Ti (nm) | 2 | 2 |
| Ag (nm) | 12 | 12 |
| Ti (nm) | 2 | 2 |
| TiOx (nm) | 30 | 30 |
| PET SUB. (μm) | 50 | 50 |
| CLEAR PVB SUB. (μm) | 380 | 380 |
| VG10 GLASS SUBSTRATE (mm) | 0.7-2.1 | 0.7-2.1 |

Optical properties of each sample composite window film are summarized in Table 2 below. The summarized optical properties include: VLT, VLR, TTS calculated according to ISO13837 convention "A" AM15, Transmission, and Reflection measured according to ISO 9050 using a Perkin Elmer Lambda 900 spectrophotometer (1=clear glass side 2=dark glass side). Further, the integrated values (L*, a*, b*) are based on a "D65 10°" illuminant.

TABLE 2

Sample Composite Film Optical Property Measurements

| OPT. PROP. | S1 | S2 |
|---|---|---|
| VLT A 2° (%) | 13.4 | 8.6 |
| VLR1 A 2° (%) | 9.5 | 10.5 |
| VLR2 A 2° (%) | 5.2 | 5.9 |
| TTS (%) | 24.2 | 23.1 |
| L*T | 44.0 | 36.0 |
| a*T | −4.1 | −3.4 |
| b*T | −3.7 | −4.8 |
| L*R1 | 37.6 | 39.3 |
| a*R1 | −3.2 | −4.0 |
| b*R1 | −2.4 | −2.4 |
| L*R2 | 27.3 | 29.1 |
| a*R2 | −0.3 | −0.2 |
| b*R2 | 1.6 | 0.9 |

A comparative sample composite film CS1 was analyzed for comparison to the sample composite films S1 and S2. The comparative sample composite film was a commercial film called the XIR75 Blue from Eastman Chemical Company (http://www.eastman.com/Brands/XIR/Automotive/Pages/Auto_Overview.aspx). Comparative sample composite film CS1 includes a bi-layer stack. The configuration of the bilayer stack, including general layer composition, arrangement and thickness, are summarized below in Table 3. It will be appreciated that the order of the layers listed in Table 3 indicates the order of the layers in bi-layer stack with the bottom row in the table corresponding to the bottom layer in the composite window film.

TABLE 3

Bi-Layer Stack Configuration for Comparative Sample Composite Film

|  | CS1 |
|---|---|
| $InO_x$ ($In_2O_3$) (nm) | 17 |
| Ag (nm) | 9.1 |
| $InO_x$ ($In_2O_3$) (nm) | 57 |
| Ag (nm) | 5.5 |
| $InO_x$ ($In_2O_3$) (nm) | 18.7 |
| Substrate (polymer) | — |

The bi-layer stack was laminated with 1 clear PVB substrate and 1 clear glass substrate on the top and 1 dark glass substrate and 1 dark PVB substrate on the bottom. The dark PVB is called RB17 and is 380 μm thick.

Optical properties of comparative sample composite film CS1 are summarized in Table 4 below. The summarized optical properties include: VLT, VLR, TTS, Transmission, and Reflection measured according to ISO 9050 using a Perkin Elmer Lambda 900 spectrophotometer.

TABLE 4

Comparative Sample Composite Window Film Optical Property Measurements

| OPT. PROP. | CS1 |
|---|---|
| VLT A 2° (%) | 7.5 |
| VLR1 A 2° (%) | 8.5 |
| VLR2 A 2° (%) | 4.7 |
| TTS (%) | 23.4 |
| L*T | 33.3 |
| a*T | −3.3 |
| b*T | −0.6 |
| L*R1 | 36.2 |
| a*R1 | −4.8 |
| b*R1 | −6.5 |
| L*R2 | 25.9 |
| a*R2 | −0.1 |
| b*R2 | −1.0 |

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A composite film consisting of:
   a first transparent substrate stack;
   a first dielectric layer adjacent to the first transparent substrate stack;
   a first titanium metal blocker layer adjacent to the first dielectric layer;
   a first functional layer comprising silver adjacent to the first titanium blocker layer;
   a second titanium metal blocker layer adjacent to the first function layer;
   a second dielectric layer adjacent to the second titanium blocker layer;
   a third titanium metal blocker layer adjacent to the second dielectric layer;
   a second functional layer comprising silver adjacent to the third titanium blocker layer;
   a fourth titanium metal blocker layer adjacent to the second function layer;
   a third dielectric layer adjacent to the fourth titanium blocker layer; and
   a second transparent substrate stack overlying to the third dielectric layer
   wherein the each of the blocker layers has a thickness of at least about 0.1 nanometers and not greater than about 5 nanometers,
   wherein each dielectric layer has a thickness of at least about 15 nanometers and not greater than about 200 nanometers,
   wherein the first transparent substrate stack (110) comprises a first polymer substrate layer and a first glass substrate layer,
   wherein the first glass substrate layer comprises a dark glass, wherein the dark glass has a VLT of at least about 10% and not greater than about 50%,
   wherein the second transparent substrate stack comprises a glass material, and
   wherein the second transparent substrate stack has a VLT of at least about 85%.

2. The composite film of claim 1, wherein the first polymer substrate layer comprises a PET or a PVB.

3. The composite film of claim 1, wherein the composite film comprises a TSER of at least about 65% and not greater than about 95%.

4. The composite film of claim 1, wherein the first functional layer consists essentially of silver.

5. The composite film of claim 1, wherein the second functional layer consists essentially of silver.

6. The composite film of claim 1, wherein the first titanium metal blocker layer consist essentially of titanium metal.

7. The composite film of claim 1, wherein the second titanium metal blocker layer consist essentially of titanium metal.

8. The composite film of claim 1, wherein the third titanium metal blocker layer consist essentially of titanium metal.

9. The composite film of claim 1, wherein the first functional layer has a thickness of at least about 5 nanometers and not greater than about 25 nanometers.

10. The composite film of claim 1, wherein the second functional layer has a thickness of at least about 5 nanometers and not greater than about 25 nanometers.

11. The composite film of claim 1, wherein the first polymer substrate layer comprises a PET.

12. The composite film of claim 1, wherein the first polymer substrate layer comprises a PVB.

13. The composite film of claim 1, wherein the first polymer substrate layer consists essentially of a PET.

14. The composite film of claim 1, wherein the first polymer substrate layer consists essentially of a PVB.

15. The composite film of claim 1, wherein the first dielectric layer comprises ITO, $SnZnO_x$, $SiO_x$, $Si_3N_4$, $Nb_2O_x$, $TiO_x$, $In_2O_x$, $ZnO_x$ or AZO.

16. The composite film of claim 1, wherein the second dielectric layer comprises ITO, $SnZnO_x$, $SiO_x$, $Si_3N_4$, $Nb_2O_x$, $TiO_x$, $In_2O_x$, $ZnO_x$ or AZO.

17. The composite film of claim 1, wherein the third dielectric layer comprises ITO, $SnZnO_x$, $SiO_x$, $Si_3N_4$, $Nb_2O_x$, $TiO_x$, $In_2O_x$, $ZnO_x$ or AZO.

18. The composite film of claim 1, wherein the composite film further comprises a thickness ratio $TH_{BL1}/TH_{FL}$ of at least about 0.01 and not greater than about 0.5, where $TH_{BL1}$ is the average thickness of the first titanium metal blocker layer, the second titanium blocker layer and the third titanium blocker layer in the composite film and $TH_{FL}$ is the average thickness of the first functional layer and the second functional layer in the composite film.

* * * * *